US008883894B2

(12) United States Patent
Sekito

(10) Patent No.: US 8,883,894 B2
(45) Date of Patent: Nov. 11, 2014

(54) INSULATING FILM AND PRINTED WIRING BOARD PROVIDED WITH INSULATING FILM

(75) Inventor: Yoshihide Sekito, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 14/002,552

(22) PCT Filed: Feb. 22, 2012

(86) PCT No.: PCT/JP2012/054267
§ 371 (c)(1),
(2), (4) Date: Aug. 30, 2013

(87) PCT Pub. No.: WO2012/117915
PCT Pub. Date: Sep. 7, 2012

(65) Prior Publication Data
US 2013/0333931 A1  Dec. 19, 2013

(30) Foreign Application Priority Data

Mar. 3, 2011 (JP) ................................. 2011-046765
Apr. 25, 2011 (JP) ................................. 2011-097504
Apr. 25, 2011 (JP) ................................. 2011-097506

(51) Int. Cl.
| C08K 5/5313 | (2006.01) |
| H05K 1/02 | (2006.01) |
| C08G 18/67 | (2006.01) |
| C08G 18/75 | (2006.01) |
| H05K 3/28 | (2006.01) |
| C08G 18/66 | (2006.01) |
| C08G 18/08 | (2006.01) |
| C08K 3/08 | (2006.01) |
| C08K 7/16 | (2006.01) |
| C08K 3/02 | (2006.01) |

(52) U.S. Cl.
CPC ............ *H05K 1/0271* (2013.01); *C08G 18/672* (2013.01); *H05K 2201/0215* (2013.01); *C08G 18/758* (2013.01); *H05K 2201/0212* (2013.01); *C08K 2003/0812* (2013.01); *H05K 3/287* (2013.01); *C08G 18/6659* (2013.01); *C08K 2201/003* (2013.01); *C08K 7/16* (2013.01); *C08G 18/0823* (2013.01); *C08K 2003/026* (2013.01); *H05K 2201/0266* (2013.01); *H05K 2201/0209* (2013.01)
USPC .......................................... 524/126; 524/133

(58) Field of Classification Search
USPC .................................................. 524/126, 133
See application file for complete search history.

(56) References Cited

U.S. PATENT DOCUMENTS

| 7,935,752 B2 | 5/2011 | Uchida et al. |
| 8,188,209 B2 | 5/2012 | Hirano et al. |
| 2009/0008132 A1 | 1/2009 | Takasawa et al. |
| 2009/0008138 A1 | 1/2009 | Uchida et al. |
| 2009/0065244 A1 | 3/2009 | Kimura et al. |
| 2010/0113689 A1 | 5/2010 | Naiki et al. |

FOREIGN PATENT DOCUMENTS

| JP | 2000-13033 | 1/2000 |
| JP | 2006-307183 | 11/2006 |
| JP | 2007/270137 | 10/2007 |
| JP | 2008/134584 | 6/2008 |
| JP | 2009/16671 | 1/2009 |
| JP | 2009/271445 | 11/2009 |
| WO | 2007/125806 | 11/2007 |
| WO | 2008/108357 | 9/2008 |

OTHER PUBLICATIONS

English translation of the International Preliminary Report on Patentability (Chapter I) of PCT Application No. PCT/JP2012/054267, Sep. 12, 2013.
English translation of PCT International Search Report, International Application No. PCT/JP2012/054267, mailed May 29, 2012.

*Primary Examiner* — Peter Szekely
(74) *Attorney, Agent, or Firm* — Kagan Binder, PLLC

(57) ABSTRACT

The present invention provides an insulating film including: a (A) binder polymer; (B) spherical organic beads; and (C) fine particles containing at least one element selected from the group consisting of phosphorus, aluminum, and magnesium, both the (B) spherical organic bead and the (C) fine particles being dispersed in a predetermined state in the insulating film.

19 Claims, 3 Drawing Sheets

F I G. 1
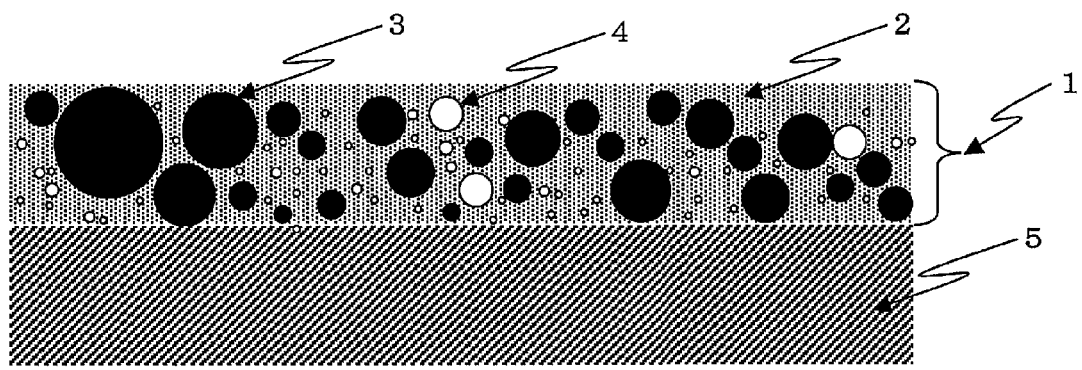

F I G. 2
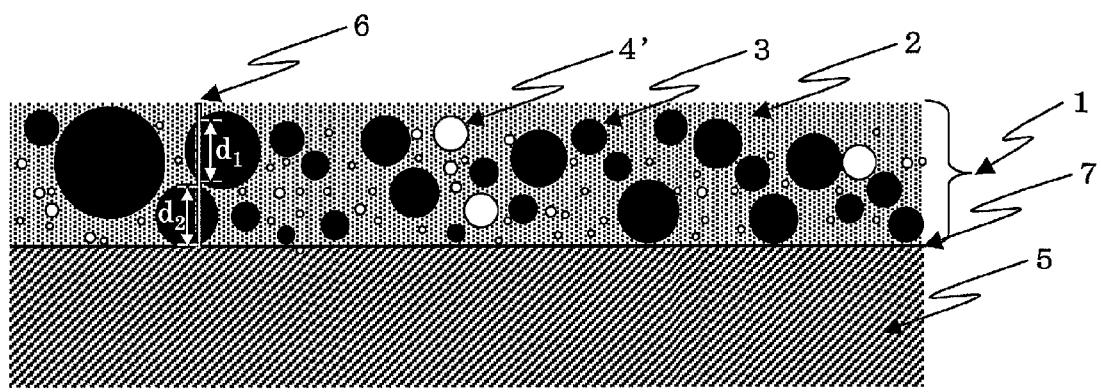

INSULATING FILM AND PRINTED WIRING BOARD PROVIDED WITH INSULATING FILM

This application claims benefit from International Application No. PCT/JP2012/054267, which was filed on Feb. 22, 2012, which in turn claims priority to Japanese Application No. 2011-046765, which was filed on Mar. 3, 2011; Japanese Application No. 2011-097504, which was filed on Apr. 25, 2011; and Japanese Application No. 2011-097506, which was filed on Apr. 25, 2011; wherein the entireties of said patent applications are incorporated herein by reference.

TECHNICAL FIELD

The present invention relates to: an insulating film having excellent tack-free property, flexibility of being able to resist repeated foldings, flame retardancy, and electrical insulation reliability and less warpage; and a printed wiring board provided with the insulating film.

BACKGROUND ART

With a recent demand for electronic devices and information terminals that are higher in functionality, smaller in size, lighter in weight, and thinner in thickness, there have been developed printed wiring boards that are higher in density, smaller in size, and lighter in weight. Amid such an ongoing development, insulating films used for the printed wiring boards have been required to have higher reliability and workability.

Among printed wiring boards, a flexible printed wiring board is excellent in reliability and is suitable for achieving weight and profile reductions of a printed wiring board because the flexible printed wiring board includes a polyimide film having excellent heat resistance, flame retardancy, electrical insulation reliability, chemical resistance, and mechanical property. Further, such a flexible printed wiring board is so excellent in flexibility as to be folded and mounted in a narrow place. This is an advantage in achieving downsizing of electronic devices.

An insulating film for the flexible printed wiring board has been used, for example, in forms of: (a) a cover lay film obtained by (i) providing an opening(s) on an adhesive-backed cover lay film, which has been obtained by applying an adhesive agent to a polyimide film or the like film, by a stamping process such as punching, (ii) making alignment of the adhesive-backed cover lay film with a circuit through the opening(s), and then (iii) subjecting the adhesive-backed cover lay film to thermocompression bonding onto the circuit by means of a thermal press or the like; (b) a cover coat obtained by (i) directly applying onto a circuit a solution which is prepared by dissolving polyimide resin or the like in an organic solvent, (ii) drying the solvent, and then (iii) curing the solution; and (c) a photosensitive solder resist obtained by (i) directly applying onto a circuit a photosensitive resin composition which is mainly composed of an acid-modified epoxy acrylate, an epoxy resin or the like, (ii) subjecting the photosensitive resin composition to microfabrication of openings by photolithography, and then (iii) curing the photosensitive resin composition applied onto the circuit.

However, the cover lay film, which is a thin film, is difficult to provide an opening(s) with high precision thereon. In addition, the cover lay film is poor in positioning accuracy and laminating workability because alignment of the cover lay film during a laminating process is often made by manually. This results in high cost of production. As for the cover coat, it is difficult to provide an opening(s) with high precision thereon because the cover coat needs to be prepared by selective application of the solution for parts other than the opening(s) of the cover coat by screen printing or the like printing technique, and the cover coat is also less flame resistant. As for the photosensitive solder resist, it is excellent in microfabrication workability because an opening(s) can be formed thereon by photolithography, but it is poor in flexibility such as flexing property and has great cure shrinkage. Due to such shortcomings, the photosensitive solder resist, when provided on a thin circuit board having excellent flexibility such as a printed wiring board, causes a great warpage of the circuit board.

As such an insulating film of the flexible printed wiring board, there have been proposed various insulating films capable of exhibiting various kinds of properties such as workability, flexibility, and flame retardancy.

For example, there have been proposed a resin composition and a cured insulating film each of which contains a novel modified polyimide resin that is excellent in both electrical insulating property and adhesiveness and is also excellent in properties such as heat resistance, flexibility, anti-warpage property, solvent resistance, chemical resistance, and flexing endurance (see, for example, Patent Literature 1).

Further, there has been proposed an insulating film made of a cured product of a thermosetting resin composition that offers a good balance of properties such as printability, tack-free property, matting property, electrical insulation property, and adhesiveness to a coated product (see, for example, Patent Literature 2).

In addition, there has been proposed a photosensitive resin composition that yields an insulating film having a sufficient elongation while ensuring a sufficient flame retardancy without using a halogen-based flame retardant (see, for example, Patent Literature 3).

CITATION LIST

Patent Literature 1
Japanese Patent Application Publication, Tokukai, No. 2006-307183 A
Patent Literature 2
WO 2007/125806
Patent Literature 3
Japanese Patent Application Publication, Tokukai, No. 2008-134584 A

SUMMARY OF INVENTION

Technical Problem

In the Patent Literatures listed above, there have been proposed various kinds of methods that are intended to solve the problems of an insulating film for a flexible printed wiring board. As described in Patent Literature 1, the insulating film made of a resin composition contains a modified polyimide resin having a flexible skeleton. Such an insulating film is therefore excellent in flexibility of being able to resist repeated foldings, electrical insulation reliability, adhesiveness, solder heat resistance, and solvent resistance and has less warpage. However, the insulating film described in Patent Literature 1 is poor in flame retardancy and is also poor in tack-free property because the insulating film obtained after a coating film is dried becomes greatly sticky. This results in the problem that printed wiring boards including the dried coating films are stuck to each other when they are overlaid. Further, as described in Patent Literature 2, the insulating film made of a thermosetting resin composition contains organic fine particles having a core-shell multilayer structure. Such an insulating film is therefore excellent in printability, matting property, tack-free property, electrical insulation property, and adhesiveness. However, the insulating film described in Patent Literature 2 is poor in flexibility of being able to resist repeated foldings and flame retardancy, and also has the problem that a coating film of the resin composition applied on a base material and then dried is deficient in tack-free property. Still further, as described in Patent Literature 3, the insulating film made of a photosensitive resin composition has an adequate flame retardancy without using a halogen-based flame retardant and is excellent in electrical insulation reliability, elongation, and resolution of an opening. However, the insulating film described in Patent Literature 3 has the problem of becoming greatly sticky after the coating film is dried and the problem of being poor in flexibility of being able to resist repeated foldings.

Solution to Problem

Inventor of the present invention studied diligently to solve the above problems. As a result of the diligent study, he found that (i) an insulating film having excellent tack-free property, flexibility of being able to resist repeated foldings, flame retardancy, and electrical insulation reliability and less warpage and (ii) a printed wiring board provided with the insulating film can be obtained from an insulating film having a structure such that fine particles are dispersed therein, the insulating film including a (A) binder polymer, the fine particles containing (B) spherical organic beads and (C) at least one element selected from the group consisting of phosphorus, aluminum, and magnesium, the (B) spherical organic beads occupying a 20% to 50% area of any 125 μm×15 μm region of a cross section of the insulating film which cross section is cut along a thickness direction of the insulating film. Based on the findings, the inventor accomplished the first aspect of the present invention.

Further, Inventor of the present invention studied diligently to solve the above problems. As a result of the diligent study, he found that (i) an insulating film having excellent tack-free property, flexibility of being able to resist repeated foldings, flame retardancy, and electrical insulation reliability and less warpage and (ii) a printed wiring board provided with the insulating film can be obtained from an insulating film including a compound having a (A) urethane bond in its molecule, the fine particles containing (B) spherical organic beads and (C) elemental phosphorus, the (B) spherical organic beads being such that a total length of the (B) spherical organic beads makes up 20% to 80% of a length of a line segment corresponding to the insulating film on an imaginary line drawn on a cross section of the insulating film which cross section is cut along a thickness direction of the insulating film, the imaginary line extending from an arbitrary point of a surface of the insulating film to a surface of a base material so as to be orthogonal to the surface of the base material. Based on the findings, the inventor accomplished a second aspect of the present invention.

The first aspect of the present invention can solve the above problems through an insulating film having a novel structure as described below.

That is, the first aspect of the present invention is an insulating film including: a compound containing a (A) binder polymer; (B) spherical organic beads; and (C) fine particles containing at least one element selected from the group consisting of phosphorus, aluminum, and magnesium, both the (B) spherical organic beads and the (C) fine particles being dispersed in the insulating film, the (B) spherical organic beads occupying a 20% to 50% area of any 125 μm×15 μm region of a cross section of the insulating film which cross section is cut along a thickness direction of the insulating film.

Further, the insulating film according to the first aspect of the present invention is preferably such that the (A) binder polymer is a compound having a urethane bond in its molecule.

Still further, the insulating film according to the first aspect of the present invention is preferably such that the (C) fine particles are fine particles containing elemental phosphorus.

Yet further, the insulating film according to the first aspect of the present invention is preferably such that more than half of the (B) spherical organic beads present in the 125 μm×15 μm region are 3 μm to 15 μm in particle diameter.

Further, the insulating film according to the first aspect of the present invention is preferably such that all of the (B) spherical organic beads present in the 125 μm×15 μm region are not larger than 15 μm in particle diameter.

Still further, the insulating film according to the first aspect of the present invention is preferably such that a (B) spherical organic bead content therein is 30 to 100 parts by weight, relative to 100 parts by weight of the (A) binder polymer.

Yet further, the insulating film according to the first aspect of the present invention is preferably such that the (B) spherical organic beads are cross-linked spherical organic beads having a urethane bond in its molecule.

Further, the insulating film according to the first aspect of the present invention is preferably such that the (C) fine particles present in the 125 μm×15 μm region are 1 μm to 10 μm in particle diameter.

Still further, the insulating film according to the first aspect of the present invention is preferably such that the (C) fine particles which are the fine particles containing the elemental phosphorus further contain elemental aluminum.

Yet further, the insulating film according to the first aspect of the present invention is preferably such that the insulating film further includes a (D) thermosetting resin.

Further, the insulating film according to the first aspect of the present invention is preferably such that the insulating film further includes a (E) photopolymerization initiator.

A printed wiring board provided with an insulating film, according to the first aspect of the present invention, is such that the printed wiring board is covered with the insulating film.

Further, the second aspect of the present invention can solve the above problems through an insulating film having a novel structure as described below.

That is, the second aspect of the present invention is an insulating film including: a (A) compound having a urethane bond in its molecule; (B) spherical organic beads; and (C) fine particles containing elemental phosphorus, both the (B) spherical organic beads and the (C) fine particles being dispersed in the insulating film, the (B) spherical organic beads being such that a total length of the (B) spherical organic beads makes up 20% to 80% of a length of a line segment corresponding to the insulating film on an imaginary line drawn on a cross section of the insulating film which cross section is cut along a thickness direction of the insulating film, the imaginary line extending from an arbitrary point of a surface of the insulating film to a surface of a base material so as to be orthogonal to the surface of the base material.

Further, the insulating film according to the second aspect of the present invention is preferably such that on the imaginary line, a line segment(s) of at least one of the (B) spherical organic beads is 3 μm to 15 μm in length.

Still further, the insulating film according to the second aspect of the present invention is preferably such that a (B) spherical organic bead content therein is 30 to 100 parts by weight, relative to 100 parts by weight of the (A) compound.

Yet further, the insulating film according to the second aspect of the present invention is preferably such that the (B) spherical organic beads are cross-linked spherical organic beads having a urethane bond in its molecule.

Further, the insulating film according to the second aspect of the present invention is preferably such that on the imaginary line, a line segment(s) of at least one of the (c) fine particles is 1 μm to 10 μm in length.

Still further, the insulating film according to the second aspect of the present invention is preferably such that the (C) fine particles which are the fine particles containing the elemental phosphorus further contain elemental aluminum.

Yet further, the insulating film according to the second aspect of the present invention is preferably such that the insulating film is made up of a resin composition containing a (D) thermosetting resin.

Further, the insulating film according to the second aspect of the present invention is preferably such that the insulating film is made up of a resin composition containing a (E) photopolymerization initiator.

A printed wiring board provided with an insulating film, according to the second aspect of the present invention, is such that the printed wiring board is covered with the insulating film.

Advantageous Effects of Invention

As described above, the insulating film according to the first aspect of the present invention is an insulating film including: a (A) binder polymer; (B) spherical organic beads; and (C) fine particles containing at least one element selected from the group consisting of phosphorus, aluminum, and magnesium, both the (B) spherical organic beads and the (C) fine particles being dispersed in the insulating film, the (B) spherical organic beads occupying a 20% to 50% area of any 125 μm×15 μm region of a cross section of the insulating film which cross section is cut along a thickness direction of the insulating film. Therefore, the insulating film according to the first aspect of the present invention is excellent in tack-free property, flexibility of being able to resist repeated foldings, flame retardancy, and electrical insulation reliability, and has less warpage. Consequently, the insulating film according to the first aspect of the present invention can be used as a protective film or the like provided on various circuit boards and yields distinguished effects.

Further, the insulating film according to the second aspect of the present invention is an insulating film including: a (A) compound having a urethane bond in its molecule; (B) spherical organic beads; and (C) fine particles containing elemental phosphorus, both the (B) spherical organic beads and the (C) fine particles being dispersed in the insulating film, the (B) spherical organic beads being such that a total length of the (B) spherical organic beads makes up 20% to 80% of a length of a line segment corresponding to the insulating film on an imaginary line drawn on a cross section of the insulating film which cross section is cut along a thickness direction of the insulating film, the imaginary line extending from an arbitrary point of a surface of the insulating film to a surface of a base material so as to be orthogonal to the surface of the base material. Therefore, the insulating film according to the second aspect of the present invention is excellent in tack-free property, flexibility of being able to resist repeated foldings, flame retardancy, and electrical insulation reliability, and has less warpage. Consequently, the insulating film according to the second aspect of the present invention can be used as a protective film or the like provided on various circuit boards and yields distinguished effects.

BRIEF DESCRIPTION OF DRAWINGS

FIG. 1

FIG. 1 is a schematic view illustrating an insulating film according to a first aspect of the present invention which aspect has a structure such that fine particles are dispersed.

FIG. 2

FIG. 2 is a schematic view illustrating an insulating film according to a second aspect of the present invention which aspect has a structure such that fine particles are dispersed.

FIG. 3 is a schematic view illustrating measurement of the amount of warpage on a film.

Figure 3:
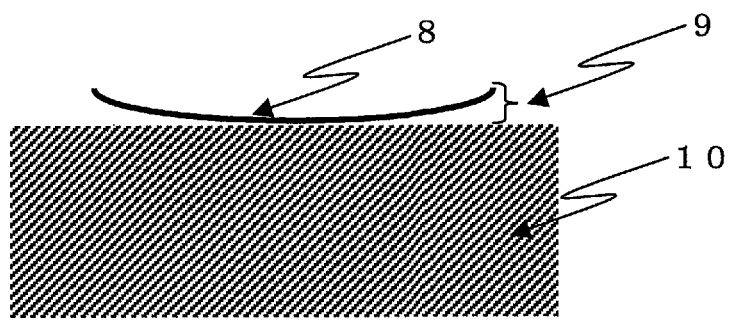
FIG. 3

DESCRIPTION OF EMBODIMENTS (1. First Aspect of Present Invention)

The description below deals in detail with first (I) an insulating film and then (II) a method for forming an insulating film in accordance with a first aspect of the present invention.

(I) Insulating Film

The insulating film according to the present invention is a film having an insulating property, and is preferably a film having a thickness of 5 μm to 50 μm.

The thickness of the insulating film according to the present invention can be measured by any method. The thickness can be measured by, for example, a method being in conformity with JIS K 5400 3.5. Controlling the thickness within the above range is preferable because the thickness controlled as such allows the insulating film to be excellent in flexibility and electrical insulation reliability. A thickness of lower than 5 μm may decrease an electrical insulation reliability of the insulating film, whereas a thickness of higher than 50 μm may decrease flexibility of the insulating film.

The inventor of the present invention has found that the insulating film of the present invention has various excellent properties, and presumes that it is for the following reason; the insulating film of the present invention is arranged to include fine particles dispersed therein. With this arrangement, the insulating film has irregularities formed at its surface as well and thus has excellent tack-free property. The insulating film includes a (A) binder polymer, and thus has excellent flexibility due to a flexible skeleton of the binder polymer. In particular, in the case where the (A) binder polymer is a compound having a urethane bond in its molecule, the insulating film has excellent flexibility due to a flexible skeleton derived from the urethane bond. In the case where the above fine particles are (B) spherical organic beads, such fine particles are, (i) because they are spherical beads, unlikely to aggregate inside the insulating film and, (ii) because they are organic matter, excellent in affinity for the insulating film serving as a matrix. This eliminates the possibility of a decrease in mechanical strength of the insulating film. In the case where the above fine particles are (C) fine particles containing at least one element selected from the group consisting of phosphorus, aluminum, and magnesium, such fine particles (i) can impart excellent flame retardancy to the insulating film, (ii) are present as a filler component inside the insulating film and thus cause no decrease in heat resistance or electrical insulation reliability of the insulating film, and (iii) cause no bleedout from the insulating film and can thus prevent, for example, (a) a contact fault at a component mounting section and (b) pollution and contamination during a step of processing the insulating film. Further, the component (B) occupies a 20% to 50% area of any 125 μm×15 μm region of a cross section of the insulating film which cross section is cut along a thickness direction of the insulating film. This arrangement allows irregularities to be effectively formed at a surface of the insulating film, thus allowing the insulating film to have particularly excellent tack-free property. The above arrangement also allows the component (B) to produce a filling effect, thus decreasing warpage of the insulating film. The above arrangement further allows the component (B) to improve, for example, a stress relaxing effect and fracture toughness of the insulating film, thus improving flexibility of being able to resist repeated foldings. Containing a filler component at a high proportion will generally decrease flexibility of resisting repeated foldings. However, the above arrangement causes the component (A) to seep into the component (B) through its surface, and thus achieves high adhesiveness at an interface between the component (A) and the component (B). Consequently, as the inventor presumes, the present invention can surprisingly provide an insulating film so flexible as to be able to resist repeated foldings even with the component (B) contained at such a high proportion as to occupy a 20% to 50% area.

The description below deals with a (A) binder polymer, (B) spherical organic beads, (C) fine particles containing at least one element selected from the group consisting of phosphorus, aluminum, and magnesium, a (D) thermosetting resin, a (E) photopolymerization initiator, other components, how the component (B) and the component (C) are dispersed in the insulating film, and an area occupied by the component (B) on a cross section of the insulating film which cross section is cut along the thickness direction of the insulating film.

<(A) Binder Polymer>

The (A) binder polymer of the present invention is a polymer that is soluble in organic solvent and that has a weight-average molecular weight of not lower than 1,000 and not higher than 1,000,000 based on polyethylene glycol.

The above organic solvent is not particularly limited to any specific one. Examples of the organic solvent include: sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone. Further, these organic solvents can be used optionally in combination with an aromatic hydrocarbon such as xylene or toluene, as needed.

Further examples of the organic solvent include: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether.

Whether a binder polymer is soluble in organic solvent is determined on the basis of an index called organic solvent solubility, which can be measured from parts by weight of the binder polymer that are dissolvable in 100 parts by weight of an organic solvent. If not smaller than 5 parts by weight of a binder polymer are dissolved in 100 parts by weight of an organic solvent, that binder polymer can be determined as soluble in organic solvent. How the organic solvent solubility is measured is not particularly limited to any specific one. The organic solvent solubility can be measured by, for example, a method of (i) adding 5 parts by weight of a binder polymer to 100 parts by weight of an organic solvent, (ii) stirring the mixture at 40° C. for 1 hour, (iii) cooling the resultant mixture down to a room temperature, (iv) leaving the cooled mixture to stand for more than 24 hours, and (v) checking whether the resulting solution is a uniform solution with no undissolved matter or precipitate produced.

The weight-average molecular weight of the component (A) of the present invention can be measured by, for example, the method below.

(Measurement of Weight-Average Molecular Weight)

Apparatus used: equivalent of HLC-8220GPC manufactured by TOSOH Corporation

Column: TSK gel Super AWM-H manufactured by TOSOH Corporation (6.0 mm I.D.×15 cm) (2 columns)

Guard column: TSK guard column Super AW-H manufactured by TOSOH Corporation

Carrier: 30 mM LiBr+20 mM H3PO4 in DMF

Flow speed: 0.6 mL/min

Column temperature: 40° C.

Detection conditions: RI:polarity (+), response (0.5 sec)

Sample concentration: approximately 5 mg/mL

Reference standard: PEG (polyethylene glycol)

Controlling the weight-average molecular weight within the above range is preferable because the weight-average molecular weight controlled as such allows a cured film produced to be excellent in flexibility and chemical resistance. A weight-average molecular weight of lower than 1,000 may decrease the flexibility and/or chemical resistance of the cured film, whereas a weight-average molecular weight of higher than 1,000,000 may increase viscosity of a photosensitive resin composition produced.

The component (A) of the present invention is not particularly limited to any specific one. Examples of the component (A) include: polyurethane resins, poly(meth)acrylic resins, polyvinyl resins, polystyrene resins, polyethylene resins, polypropylene resins, polyimide resins, polyamide resins, polyacetal resins, polycarbonate resins, polyester resins, polyphenylene ether resins, polyphenylene sulfide resins, polyether sulfone resins, and polyether ether ketone resins. These resins can be used solely, or two or more types thereof can be used in combination. The component (A) is preferably, among the above resins, a polyurethane resin or poly(meth)acrylic resin, each of which is a compound having a urethane bond in its molecule. This preference is because such an arrangement causes the component (A) to likely seep into the component (B) having oil absorbency, and thus achieves high adhesiveness at an interface between the component (A) and the component (B). Consequently, with the above arrangement, a cured film produced by curing a photosensitive resin composition including the component (A) and the component (B) is improved in flexibility and folding endurance, and thus has less warpage.

<Compound Having Urethane Bond in Molecule>

The present invention suitably uses, as the compound having a urethane bond in its molecule, an organic compound having at least one urethane bond in its molecule.

Whether the insulating film according to the present invention contains a compound having a urethane bond in its molecule can be determined by any method. An example method is a method of (i) scraping off several micrometers of a surface of the insulating film with use of an oblique-cutting apparatus or the like, (ii) analyzing a continuous phase of the obtained slice of the insulating film by an infrared absorption microspectrometry (μIR), and (iii) determining whether a spectrum derived from stretching vibration between C=O in a urethane bond is present within or near a range of 1715 $cm^{-1}$ to 1730 $cm^{-1}$.

(Oblique-Cutting Apparatus)

Apparatus used: equivalent of SAICAS DN-20S model manufactured by Daipla Wintes Co., Ltd.

Cutting blade: material: diamond, width: 0.3 mm, rake angle: 20°, clearance angle: 10°

Measurement mode: low pressure mode (Infrared Absorption Spectrum Microanalysis)

Apparatus used: equivalent of NICOLET6700/NICOLET (CON TINUμM) manufactured by Thermo SCIENTIFIC Measurement region: 700 $cm^{-1}$ to 4000 $cm^{-1}$ Detector: MCT Resolving power: 4 $cm^{-1}$ Number of integrations: 500 times Measurement method: transmission method The above method can achieve improved determination accuracy in the case where it is combined with a method of (i) performing pyrolysis gas chromatography/mass spectroscopy (PyGC/MS) on the obtained slice of the insulating film, (ii) searching a library for a detected peak of the MS spectrum to qualitatively determine a component, and (iii) determining whether there is present a peak derived from a diisocyanate compound, which is a raw material for forming a urethane bond.

(Pyrolysis Gas Chromatography/Mass Spectroscopy)

Apparatus used: equivalent of GC/MS-5973N manufactured by Agilent Technologies

Column: DB-5MS 0.25 mmϕ×30 m (0.25 μm) manufactured by J&W

Column temperature: 35° C. (5-min hold)->10° C./min->290° C. (19.5-min hold)

Carrier: 1 mL/min of helium

Injection method: split (1:50)

Inlet temperature: 290° C.

Interface temperature: 290° C.

Pyrolyzer: equivalent of JCI-22 type pyrolyzer manufactured by Japan Analytical Industry Co., Ltd.

Pyrolysis condition: 250° C.×0.5 min

The compound having a urethane bond in its molecule in accordance with the present invention can be produced through any reaction. The compound can be produced by, for example, reacting (i) a diol compound represented by General Formula (1):

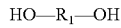

HO—$R_1$—OH            General Formula (1)

where $R_1$ represents a divalent organic group, with (ii) a diisocyanate compound represented by General Formula (2):

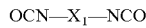

OCN—$X_1$—NCO            General Formula (2)

where $X_1$ represents a divalent organic group, into a structure containing a repeating unit that has a urethane bond represented by General Formula (3):

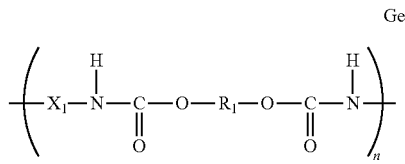

General Formula (3)

where $R_1$ and $X_1$ each independently represent a divalent organic group, and n represents an integer of 1 or more.

The diol compound is not particularly limited to any specific one as long as it has the above structure. Examples of the diol compound include: alkylene diols such as ethyleneglycol, diethylene glycol, propylene glycol, 1,3-butanediol, 1,4-butanediol, 1,5-pentanediol, neopentyl glycol, 3-methyl-1,5-pentanediol, 1,6-hexanediol, 1,8-octanediol, 2-methyl-1,8-octanediol, 1,9-nonanediol, 1,10-decanediol, 1,4-cyclohexanediol, and 1,4-cyclohexanedimethanol; polyoxyalkylene diols such as polyethylene glycol, polypropylene glycol, polytetramethylene glycol, and a random copolymer of tetramethylene glycol and neopentyl glycol; a polyester diol obtained by reacting polyhydric alcohol with polybasic acid; a polycarbonate diol having a carbonate skeleton; a polycaprolactone diol obtained by performing ring opening addition of lactones such as γ-butyl lactone, ε-caprolactone, and δ-valerolactone; bisphenol A, an ethylene oxide adduct of bisphenol A; a propylene oxide adduct of bisphenol A; hydrogenated bisphenol A; an ethylene oxide adduct of hydrogenated bisphenol A; and a propylene oxide adduct of hydrogenated bisphenol A. These compounds can be used solely, or two or more types thereof can be used in combination.

The diisocyanate compound is not particularly limited to any specific one as long as it has the above structure. Examples of the diisocyanate compound include: aromatic diisocyanate compounds such as diphenylmethane-2,4'-diisocyanate, 3,2'-, 3,3'-, 4,2'-, 4,3'-, 5,2'-, 5,3'-, 6,2'-, or 6,3'-dimethyl diphenylmethane-2,4'-diisocyanate, 3,2'-, 3,3'-, 4,2'-, 4,3'-, 5,2'-, 5,3'-, 6,2'-, or 6,3'-diethyl diphenylmethane-2,4'-diisocyanate, 3,2'-, 3,3'-, 4,2'-, 4,3'-, 5,2'-, 5,3'-, 6,2'-, or 6,3'-dimethoxy diphenylmethane-2,4'-diisocyanate, diphenylmethane-4,4'-diisocyanate, diphenylmethane-3,3'-diisocyanate, diphenylmethane-3,4'-diisocyanate, diphenylether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, and 4,4'-[2,2-bis(4-phenoxyphenyl)propane]diisocyanate; alicyclic diisocyanate compounds such as hydrogenated diphenylmethane diisocyanate, hydrogenated xylylene diisocyanate, isophorone diisocyanate, and norbornene diisocyanate; and aliphatic diisocyanate compounds such as hexamethylene diisocyanate, trimethyl hexamethylene diisocyanate, and lysine diisocyanate. These compounds can be used solely, or two or more types of them can be used in combination.

The compound having a urethane bond in its molecule may further contain at least one organic group selected from the group consisting of a (a1) (meth)acryloyl group, a (a2) carboxyl group, and an (a3) imide group. The term "(a1) (meth) acryloyl group" refers to an acryloyl group and/or a methacryloyl group. With the compound containing the (a1) (meth)acryloyl group, in the case where the insulating film is made of a photosensitive resin composition, the (a1) (meth)acryloyl group improves photosensitivity, and thus allows the insulating film to be cured by ultraviolet irradiation performed over a short time period. With the compound containing the (a2) carboxyl group, in the case where the insulating film includes a thermosetting resin, the carboxyl group reacts with the thermosetting resin, the reaction allowing the insulating film to be improved in, for example, (i) heat resistance and (ii) electrical insulation reliability at high temperature and high humidity. Further, containing the (a3) imide group in the compound allows the insulating film to be improved in, for example, (i) heat resistance, (ii) flame retardancy, and (iii) electrical insulation reliability at high temperature and high humidity.

The compound having a urethane bond in its molecule, the compound containing the (a1) (meth)acryloyl group, can be produced through any reaction. Such a compound can be produced by, for example, reacting, in addition to the diol compound and the diisocyanate compound, (i) a compound containing a hydroxy group and at least one (meth)acryloyl group, the compound being represented by General Formula (4):

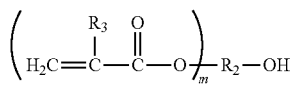

General Formula (4)

where $R_2$ represents an organic group having a valence of m+1, $R_3$ represents a hydrogen or an alkyl group, and m represents an integer of 1 to 3, and/or (ii) a compound containing an isocyanate group and at least one (meth)acryloyl group, the compound being represented by General Formula (5):

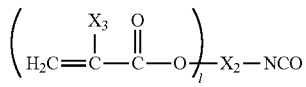

General Formula (5)

where $X_2$ represents an organic group having a valence of l+1, $X_3$ represents a hydrogen or an alkyl group, and l represents an integer of 1 to 3.

The compound containing a hydroxy group and at least one (meth)acryloyl group is not particularly limited to any specific one as long as it has the above structure. Examples of the compound include: 2-hydroxyethyl(meth)acrylate; 2-hydroxypropyl(meth)acrylate; 2-hydroxybutyl(meth)acrylate; 2-hydroxy-3-phenoxypropyl (meth)acrylate; 2-hydroxy-1-acryloxy-3-methacryloxypropane; o-phenylphenol glycidyl ether (meth)acrylate; polyethylene glycol mono(meth)acrylate; pentaerythritol tri(meth)acrylate; tris(2-hydroxyethyl) isocyanurate di(meth)acrylate; 1,4-cyclohexanedimethanol mono(meth)acrylate; 4-hydroxyphenyl (meth)acrylate; 2-(4-hydroxyphenyl)ethyl (meth)acrylate; N-methylolacrylamide; and 3,5-dimethyl-4-hydroxybenzyl acrylamide. These compounds can be used solely, or two or more types thereof can be used in combination.

The compound containing an isocyanate group and at least one (meth)acryloyl group is not particularly limited to any specific one as long as it has the above structure. Examples of the compound include: 2-(meth)acryloyloxyethyl isocyanate; 1,1-(bisacryloyloxymethy) ethyl isocyanate; and 2-(2-methacryloyloxyethyl oxy) ethyl isocyanate. These compounds can be used solely, or two or more types thereof can be used in combination.

The compound having a urethane bond in its molecule, the compound containing the (a2) carboxyl group, can be produced through any reaction. Such a compound can be produced by, for example, reacting, in addition to the diol compound and the diisocyanate compound, a compound containing two hydroxy groups and one carboxyl group, the compound being represented by General Formula (6):

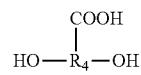

General Formula (6)

where $R_4$ represents a trivalent organic group.

The compound containing two hydroxy groups and one carboxyl group is not particularly limited to any specific one as long as it has the above structure. Examples of the compound include: 2,2-bis(hydroxymethyl)propionic acid; 2,2-bis(2-hydroxyethyl)propionic acid; 2,2-bis(3-hydroxypropyl)propionic acid; 2,3-dihydroxy-2-methylpropionic acid; 2,2-bis(hydroxymethyl)butanoic acid; 2,2-bis(2-hydroxyethyl)butanoic acid; 2,2-bis(3-hydroxypropyl)butanoic acid; 2,3-dihydroxybutanoic acid; 2,4-dihydroxy-3,3-dimethylbutanoic acid; 2,3-dihydroxyhexadecanoic acid; 2,3-dihydroxybenzoic acid; 2,4-dihydroxybenzoic acid; 2,5-dihydroxybenzoic acid; 2,6-dihydroxybenzoic acid; 3,4-dihydroxybenzoic acid; and 3,5-dihydroxybenzoic acid. These compounds can be used solely, or two or more types thereof can be used in combination.

The compound having a urethane bond in its molecule, the compound containing the (a3) imide group, can be produced through any reaction. Such a compound can be produced by, for example, reacting, in addition to the diol compound and the diisocyanate compound, a tetracarboxylic acid dianhydride represented by General Formula (7):

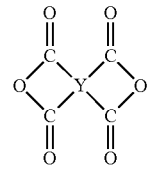

General Formula (7)

where Y represents a tetravalent organic group.

The tetracarboxylic acid dianhydride is not particularly limited to any specific one as long as it has the above structure. Examples of the tetracarboxylic acid dianhydride include: 3,3',4,4'-benzophenone tetracarboxylic acid dianhydride; pyromellitic acid dianhydride; 3,3',4,4'-oxydiphthalic acid dianhydride; 2,2-bis[4-(3,4-dicarboxyphenoxy)phenyl]propane dianhydride; 2,2-bis(4-hydroxyphenyl)propane dibenzoate-3,3',4,4'-tetracarboxylic acid dianhydride; 3,3',4,4'-diphenyl sulfone tetracarboxylic acid dianhydride; 3,3',4,4'-biphenyltetracarboxylic acid dianhydride; 2,3,3',4-biphenyltetracarboxylic acid dianhydride; and 5-(2,5-dioxotetrahydro-3-furanyl)-3-methyl-3-cyclohexene-1,2-dicarboxylic acid anhydride. These tetracarboxylic acid dianhydrides can be used solely, or two or more types thereof can be used in combination.

The compound having a urethane bond in its molecule is synthesized by a method of (i) mixing the diol compound with the diisocyanate compound in such respective amounts that isocyanate groups and hydroxy groups are contained at a number ratio of isocyanate groups/hydroxy groups of not smaller than 0.5 and not larger than 2.0, and (ii) reacting the mixture without any solvent or in an organic solvent.

Further, in the case where two or more types of the diol compound are used, the reaction thereof with the diisocyanate compound may be performed after the two or more types of the diol compound are mixed, or each of the two or more types of the diol compound may be reacted with the diisocyanate compound independently. Alternatively, the reaction may be performed such that (i) a diol compound is initially reacted with the diisocyanate compound, (ii) the resultant terminal isocyanate compound is reacted with another diol compound, and (iii) a reactant is further reacted with the diisocyanate compound. Further, in the case where two or more types of the diisocyanate compound are used, the reaction can be performed in the same manner as above. In this way, an intended compound having a urethane bond in its molecule can be prepared.

The reaction between the diol compound and the diisocyanate compound is performed at a temperature of preferably (i) 40° C. to 160° C., or more preferably (ii) 60° C. to 150° C. If the temperature is less than 40° C., the reaction takes too much time. If the temperature exceeds 160° C., a three-dimensional reaction occurs during the reaction, which easily causes gelatinization. How long the reaction is performed can be determined as appropriate depending on a batch scale and a reaction condition to be used. Further, the reaction may optionally be performed in the presence of a catalyst such as (i) a tertiary amine or (ii) a metal compound or semi-metal compound (for example, alkaline metal, alkaline earth metal, tin, zinc, titanium, or cobalt).

The above reaction, which can be performed without any solvent, is desirably performed with an organic solvent system for the sake of better control of the reaction. Examples of the organic solvent include those listed under <(A) Binder Polymer> above.

It is desirable that the organic solvent used in the reaction be added in such an amount that a solute weight concentration in a reaction solution, that is, a concentration of the reaction solution, is not lower than 5% by weight and not higher than 90% by weight. The solute weight concentration in the reaction solution is more preferably not lower than 10% by weight and not higher than 80% by weight. If the concentration of the reaction solution is lower than 5% by weight, it will be difficult to produce a polymerization reaction, and a reaction speed will decrease. As a result, an intended structural substance may not be prepared.

<Poly(Meth)Acrylic Resin>

The present invention suitably uses, as the above poly(meth)acrylic resin, a polymer that is soluble in organic solvent, that contains a repeating unit produced by copolymerizing a (meth)acrylic acid and/or (meth)acrylic ester derivative, and that has a weight-average molecular weight of not lower than 1,000 and not higher than 1,000,000 based on polyethylene glycol.

The above poly(meth)acrylic resin can be produced through any reaction. The poly(meth)acrylic resin can be produced by, for example, reacting a (meth)acrylic acid and/or (meth)acrylic ester derivative in a solvent in the presence of a radical polymerization initiator.

The above (meth)acrylic ester derivative is not particularly limited to any specific one. Examples of the (meth)acrylic ester derivative include: methyl (meth)acrylate; ethyl (meth)acrylate; butyl (meth)acrylate; isobutyl (meth)acrylate; tert-butyl (meth)acrylate; hexyl (meth)acrylate; 2-ethylhexyl (meth)acrylate; octyl (meth)acrylate; nonyl (meth)acrylate; decyl (meth)acrylate; dodecyl (meth)acrylate; stearyl (meth)acrylate; and benzyl (meth)acrylate. These (meth)acrylic ester derivatives can be used solely, or two or more types thereof can be used in combination. The present invention preferably uses, among the above (meth)acrylic ester derivatives, methyl (meth)acrylate, ethyl (meth)acrylate, or butyl (meth)acrylate in particular for better flexibility and chemical resistance of a cured film of a photosensitive resin composition.

Examples of the above radical polymerization initiator include: azo-based compounds such as azobisisobutyronitrile, azobis(2-methylbutylonitrile), and 2,2'-azobis-2,4-dimethyl valeronitrile; organic peroxides such as t-butylhydroperoxide, cumene hydroperoxide, benzoyl peroxide, dicumyl peroxide, and di-t-butyl peroxide; persulfates such as potassium persulfate, sodium persulfate, and ammonium persulfate; and hydrogen peroxide. These radical polymerization initiators can be used solely, or two or more types thereof can be used in combination.

The radical polymerization initiator is used in an amount that is, with respect to 100 parts by weight of a monomer used, preferably 0.001 to 5 parts by weight or more preferably 0.01 to 1 parts by weight. If the amount is smaller than 0.001 parts by weight, the reaction does not proceed readily. If the amount is larger than 5 parts by weight, the molecular weight may be decreased.

The solvent used in the reaction is added in such an amount that a solute weight concentration in a reaction solution, that is, a concentration of the reaction solution, is preferably (i) not lower than 5% by weight and not higher than 90% by weight, or more preferably (ii) not lower than 20% by weight and not higher than 70% by weight. If the concentration of the reaction solution is lower than 5% by weight, it will be difficult to produce a polymerization reaction, and a reaction speed will decrease. As a result, an intended structural substance may not be prepared. If the concentration of the reaction solution is higher than 90% by weight, the reaction solution will be highly viscous, which may render the reaction ununiform.

The reaction is performed at a temperature of preferably (i) 20° C. to 120° C., or more preferably (ii) 50° C. to 100° C. If the temperature is lower than 20° C., the reaction takes too much time. If the temperature exceeds 120° C., a rapid procession of the reaction and a side reaction may cause three-dimensional crosslinking, which may in turn cause gelatinization. How long the reaction is performed can be determined as appropriate depending on a batch scale and a reaction condition to be used.

<(B) Spherical Organic Beads>

The (B) spherical organic beads of the present invention are a spherical polymer containing carbon, and include elliptical beads as well.

The component (B) of the present invention has an average particle diameter that can be measured from, for example, a volume-based median size (that is, a particle diameter relative to an integrated distribution value of 50%) by the method below.

(Average Particle Diameter Measurement)

Apparatus used: equivalent of LA-950 V2 manufactured by Horiba, Ltd.

Measurement method: laser differential/scattering method

The component (B) of the present invention preferably has an average particle diameter of 3 µm to 15 µm for excellent flexibility and chemical resistance of the insulating film. An average particle diameter of smaller than 3 µm may not allow irregularities to be formed effectively at a surface of the insulating film, with the result of decreased tack-free property. An average particle diameter of larger than 15 µm may, for example, (i) decrease folding endurance and/or (ii) cause particles to be exposed through an opening caused during fine pattern formation, with the result of a resolution defect.

The component (B) of the present invention is not particularly limited to any specific one. Examples as polymethyl methacrylate-based spherical organic beads include Ganz Pearls GM-0600 and GM-0600W (product names) manufactured by Ganz Chemical Co., Ltd. Examples as crosslinked polymethyl methacrylate-based spherical organic beads include (i) Ganz Pearls GM-0801S, GM-0807S, GM-1001-S, GM-1007S, GM-1505S-S, GMX-0610, GMX-0810, GMP-0800, GMDM-050M, GMDM-080M, GMDM-100M, and GMDM-150M (product names) manufactured by Ganz Chemical Co., Ltd. and (ii) Tech Polymers MBX-5, MBX-8, and MBX-12 (product names) manufactured by Sekisui Plastics Co., Ltd. Examples as crosslinked polybutyl methacrylate-based spherical organic beads include (i) Ganz Pearls GB-05S, GB-08S, GB-10S, and GB-15S (product names) manufactured by Ganz Chemical Co., Ltd. and (ii) Tech Polymers BM30X-5 and BM30X-8 (product names) manufactured by Sekisui Plastics Co., Ltd. Examples as crosslinked acrylic-based spherical organic beads include Ganz Pearl GMP-0820 (product name) manufactured by Ganz Chemical Co., Ltd. Examples as acrylic copolymer-based spherical organic beads include Ganz Pearl GBM-55COS (product name) manufactured by Ganz Chemical Co., Ltd. Examples as crosslinked styrene-based spherical organic beads include (i) Ganz Pearls GS-0605 and GS-1105 (product names) manufactured by Ganz Chemical Co., Ltd. and (ii) Tech Polymers SBX-6 and SBX-8 (product names) manufactured by Sekisui Plastics Co., Ltd. Examples as crosslinked polyacrylic ester-based organic beads include Tech Polymers ABX-8, AF10X-8, AFX-15, and ARX-15 (product names) manufactured by Sekisui Plastics Co., Ltd. Examples as nylon-based spherical organic beads include Ganz Pearl GPA-550 (product name) manufactured by Ganz Chemical Co., Ltd. Examples as silicone-based spherical organic beads include Ganz Pearls SI-020, SI-030, and SI-045 (product names) manufactured by Ganz Chemical Co., Ltd. Examples as crosslinked silicone-based spherical organic beads include Ganz Pearl SIG-070 (product name) manufactured by Ganz Chemical Co., Ltd. Examples as crosslinked urethane-based spherical organic beads include (i) Daimic Beads UCN-8070CM Clear, UCN-8150CM Clear, UCN-5070D Clear, and UCN-5150D Clear (trade names) manufactured by Dainichiseika Colour 86 Chemicals Mfg. Co., Ltd. and (ii) Art Pearl C-100 Transparent, C-200 Transparent, C-300 Transparent, C-300WA, C-400 Transparent, C-400WA, C-600 Transparent, C-800 Transparent, C-800WA, P-400T, P-800T, U-600T, CF-600T, JB-400T, JB-800T, CE-400T, and CE-800T (trade names) manufactured by Negami Chemical Industrial Co., Ltd. These can be used solely, or two or more types thereof can be used in combination.

Preferably, the component (B) of the present invention is particularly, among the above-listed spherical organic beads, crosslinked spherical organic beads having a urethane bond in its molecule for reduced warpage of the insulating film and for improvement in (i) flexibility of being able to resist repeated foldings and (ii) adhesiveness with respect to the component (A).

The component (B) according to the present invention is contained at an amount that is, with respect to 100 parts by weight of the component (A), preferably 30 to 100 parts by weight, or more preferably 40 to 80 parts by weight. This arrangement allows irregularities to be effectively formed at a surface of the insulating film produced, thus allowing the insulating film to have excellent tack-free property. The above arrangement also allows the component (B) to produce a filling effect, thus decreasing warpage of the insulating film. The above arrangement further improves, for example, a stress relaxing effect and fracture toughness of the insulating film, thus improving flexibility of being able to resist repeated foldings. Containing the component (B) at an amount smaller than 30 parts by weight may cause a decrease in tack-free property and/or flexibility of being able to resist repeated foldings. Containing the component (B) at an amount larger than 100 parts by weight may (i) cause a decrease in flame retardancy and/or ease of coating with a resin composition solution, and consequently (ii) cause foaming of a coating film during coating and/or an appearance defect due to insufficient leveling.

<(C) Fine Particles Containing at Least One Element Selected from Group Consisting of Phosphorus, Aluminum, and Magnesium>

The (C) fine particles, according to the present invention, containing at least one element selected from the group consisting of phosphorus, aluminum, and magnesium are each a fine particle containing, in its structure, at least one element selected from the group consisting of at least one phosphorus, aluminum, and magnesium.

The insulating film according to the present invention contains the component (C), which (i) can impart excellent flame retardancy to the insulating film, (ii) is present as a filler component inside the insulating film and thus causes no decrease in heat resistance or electrical insulation reliability of the insulating film, and (iii) causes no bleedout from the insulating film and can thus prevent, for example, (a) a contact fault at a component mounting section and (b) pollution and contamination during a step of processing the insulating film.

The component (C) according to the present invention has an average particle diameter that can be measured by, for example, a method similar to that for the component (B).

The component (C) according to the present invention preferably has an average particle diameter of 1 µm to 10 µm for excellent flexibility and flame retardancy of the insulating film. An average particle diameter of smaller than 1 µm may not allow irregularities to be formed effectively at a surface of the insulating film, with the result of decreased tack-free property. An average particle diameter of larger than 10 µm may, for example, (i) decrease folding endurance and/or (ii) cause particles to be exposed through an opening caused during fine pattern formation, with the result of a resolution defect.

The component (C) according to the present invention is not particularly limited to any specific one. Examples of fine particles containing elemental phosphorus include: those of ammonium polyphosphate; those of melamine phosphate; and those of phosphinate. Examples of fine particles containing elemental aluminum include those of aluminum hydroxide. Examples of fine particles containing elemental magnesium include those of magnesium hydroxide. These fine particles can be used solely, or two or more types thereof can be used in combination.

The fine particles containing elemental phosphorus are preferably those of phosphinate in particular because such fine particles can impart excellent flame retardancy to the insulating film and cause only a little bleedout from the insulating film. This arrangement makes it possible to prevent a contact fault and pollution during a process.

The above phosphinate is a compound represented by General Formula (8):

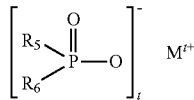

General Formula (8)

where, $R_5$ and $R_6$ each independently represent a linear or branched alkyl group or aryl group having 1 to 6 carbon atoms; M represents at least one metal selected from the group consisting of Mg, Ca, Al, Sb, Sn, Ge, Ti, Fe, Zr, Zn, Ce, Bi, Sr, Mn, Li, Na, and K; and t represents an integer of 1 to 4.

The above phosphinate is not particularly limited to any specific one as long as it has the above structure. Examples of the phosphinate include: aluminum trisdiethylphosphinate; aluminum trismethylethylphosphinate; aluminum trisdiphenylphosphinate; zinc bisdiethylphosphinate; zinc bismethylethylphosphinate; zinc bisdiphenylphosphinate; titanyl bisdiethylphosphinate; titanyl bismethylethylphosphinate; and titanyl bisdiphenylphosphinate. These phosphinates can be used solely, or two or more types thereof can be used in combination.

The fine particles containing elemental phosphorus preferably further contain elemental aluminum for higher flame retardancy. In particular, containing aluminum trisdiethylphosphinate or aluminum trismethylethylphosphinate, each containing elemental aluminum, is preferable for even higher flame retardancy.

Examples of the fine particles containing elemental aluminum include: those of gibbsite type aluminum hydroxide; those of boehmite type aluminum hydroxide; those of aluminum trisdiethylphosphinate; those of aluminum trismethylethylphosphinate; and those of aluminum trisdiphenylphosphinate. These fine particles can be used solely, or two or more types thereof can be used in combination. Containing, in the insulating film, the fine particles containing elemental aluminum is preferable because such fine particles are, when contained in the insulating film, present therein as a filler and can impart excellent flame retardancy to the insulating film without decreasing the glass transition temperature of the insulating film.

Examples of the fine particles containing elemental magnesium include: those of magnesium hydroxide; and those of magnesium oxide. These fine particles can be used solely, or two or more types thereof can be used in combination. Containing, in the insulating film, the fine particles containing elemental magnesium is preferable because such fine particles are, when contained in the insulating film, present therein as a filler and can impart excellent flame retardancy to the insulating film without decreasing the glass transition temperature of the insulating film.

The component (C) of the present invention is contained at an amount that is, with respect to 100 parts by weight of the component (A), preferably 20 to 80 parts by weight, or more preferably 25 to 75 parts by weight. This arrangement allows a cured film produced to be excellent in flame retardancy and electrical insulation reliability. Containing the component (C) at an amount smaller than 20 parts by weight may cause a decrease in flame retardancy. Containing the component (C) at an amount larger than 80 parts by weight may (i) cause a decrease in ease of coating with a resin composition solution, and consequently (ii) cause foaming of a coating film during coating and/or an appearance defect due to insufficient leveling.

<(D) Thermosetting Resin>

The (D) thermosetting resin according to the present invention is a compound containing at least one thermosetting organic group in its molecule.

An insulating film containing the (D) thermosetting resin, according to the present invention, is an insulating film including a resin composition containing the component (D).

Containing the component (D) in the insulating film according to the present invention can (i) impart excellent heat resistance and electrical insulation reliability to the insulating film and (ii) improve adhesiveness of the insulating film with respect to various base materials, copper foil, and thermosetting adhesive.

The component (D) is not particularly limited to any specific one as long as it has the above structure. Examples of the component (D) include: epoxy resin; oxetane resin; phenol resin; isocyanate resin; block isocyanate resin; bismaleimide resin; bisallylnadiimide resin; polyester resin (for example, unsaturated polyester resin); diallyl phthalate resin; silicone resin; vinyl ether resin; melamine resin; polybismaleimide triazine resin (BT resin); cyanate resin (for example, cyanate ester resin); urea resin; guanamine resin; sulfonamide resin; aniline resin; polyurea resin; thiourethane resin; polyazomethine resin; episulphide resin; ene-thiol resin; benzoxazine resin; a copolymer resin thereof; a modified resin produced by modifying any of the above; and a mixture of any of the above or mixture of any of the above with any other resin.

The component (D) is preferably a polyfunctional epoxy resin in particular among the above thermosetting resins because a polyfunctional epoxy resin can impart, to the insulating film, heat resistance and adhesiveness with respect to, for example, (i) a conductor such as a metal foil and (ii) a circuit board.

The above polyfunctional epoxy resin is a compound having at least two epoxy groups in its molecule. Examples of the polyfunctional epoxy resin include: (i) bisphenol A type epoxy resins such as jER 828, jER 1001, and jER 1002 (trade names) manufactured by Japan Epoxy Resins Co., Ltd.; ADEKA RESIN EP-4100E and ADEKA RESIN EP-4300E (trade names) manufactured by ADEKA Corporation; RE-310S and RE-410S (trade names) manufactured by Nippon Kayaku Co., Ltd.; EPICLON 840S, EPICLON 850S, EPICLON 1050, and EPICLON 7050 (trade names) manufactured by Dainippon Ink and Chemicals Inc.; and EPOTOHTO YD-115, EPOTOHTO YD-127, and EPOTOHTO YD-128 (trade names) manufactured by Tohto Kasei Co., Ltd., (ii) bisphenol F type epoxy resins such as jER 806 and jER 807 (trade names) manufactured by Japan Epoxy Resins Co., Ltd.; ADEKA RESIN EP-4901E, ADEKA RESIN EP-4930, and ADEKA RESIN EP-4950 (trade names) manufactured by ADEKA Corporation; RE-303S, RE-304S, RE-403S, and RE-404S (trade names) manufactured by Nippon Kayaku Co., Ltd.; EPICLON 830 and EPICLON 835 (trade names) manufactured by Dainippon Ink and Chemicals Inc.; and EPOTOHTO YDF-170, EPOTOHTO YDF-175S, and EPOTOHTO YDF-2001 (trade names) manufactured by Tohto Kasei Co., Ltd., (iii) bisphenol-S type epoxy resins such as EPICLON EXA-1514 (trade name) manufactured by Dainippon Ink and Chemicals Inc., (iv) hydrogenated bisphenol A type epoxy resins such as jERYX 8000, jERYX 8034, and jERYL 7170 (trade names) manufactured by Japan Epoxy Resins Co., Ltd.; ADEKA RESIN EP-4080E (trade name) manufactured by ADEKA Corporation; EPICLON EXA-7015 (trade name) manufactured by Dainippon Ink and Chemicals Inc.; and EPOTOHTO YD-3000 and EPOTOHTO YD-4000D (trade names) manufactured by Tohto Kasei Co., Ltd., (v) biphenyl type epoxy resins such as jERYX 4000, jERYL 6121H, jERYL 6640, and jERYL 6677 (trade names) manufactured by Japan Epoxy Resins Co., Ltd.; and NC-3000 and NC-3000H (trade names) manufactured by Nippon Kayaku Co., Ltd., (vi) phenoxy type epoxy resins such as jER 1256, jER 4250, and jER 4275 (trade names) manufactured by Japan Epoxy Resins Co., Ltd., (vii) naphthalene type epoxy resins such as EPICLON HP-4032, EPICLON HP-4700, and EPICLON HP-4200 (trade names) manufactured by Dainippon Ink and Chemicals Inc.; and NC-7000L (trade name) manufactured by Nippon Kayaku Co., Ltd., (viii) phenol novolac type epoxy resins such as jER 152 and jER 154 (trade names) manufactured by Japan Epoxy Resins Co., Ltd.; EPPN-201-L (trade name) manufactured by Nippon Kayaku Co., Ltd.; EPICLON N-740 and EPICLON N-770 (trade names) manufactured by Dainippon Ink and Chemicals Inc.; and EPOTOHTO YDPN-638 (trade name) manufactured by Tohto Kasei Co., Ltd., (ix) cresol novolac type epoxy resins such as EOCN-1020, EOCN-102S, EOCN-103S, and EOCN-104S (trade names) manufactured by Nippon Kayaku Co., Ltd.; and EPICLON N-660, EPICLON N-670, EPICLON N-680, and EPICLON N-695 (trade names) manufactured by Dainippon Ink and Chemicals Inc., (x) trisphenolmethane type epoxy resins such as EPPN-501H, EPPN-501HY, and EPPN-502H (trade names) manufactured by Nippon Kayaku Co., Ltd., (xi) dicyclopentadiene type epoxy resins such as XD-1000 (trade name) manufactured by Nippon Kayaku Co., Ltd.; and EPICLON HP-7200 (trade name) manufactured by Dainippon Ink and Chemicals Inc., (xii) amine type epoxy resins such as jER 604 and jER 630 (trade names) manufactured by Japan Epoxy Resins Co., Ltd.; EPOTOHTO YH-434 and EPOTOHTO YH-434L (trade names) manufactured by Tohto Kasei Co., Ltd.; and TETRAD-X and TERRAD-C (trade names) manufactured by Mitsubishi Gas Chemical Co., Inc., (xiii) flexible epoxy resins such as jER 871, jER 872, jERYL 7175, and jERYL 7217 (trade names) manufactured by Japan Epoxy Resins Co., Ltd.; and EPICLON EXA-4850 (trade name) manufactured by Dainippon Ink and Chemicals Inc., (xiv) urethane-denatured epoxy resins such as ADEKA RESIN EPU-6, ADEKA RESIN EPU-73, and ADEKA RESIN EPU-78-11 (trade names) manufactured by ADEKA Corporation, (xv) rubber-denatured epoxy resins such as ADEKA RESIN EPR-4023, ADEKA RESIN EPR-4026, and ADEKA RESIN EPR-1309 (trade names) manufactured by ADEKA Corporation, (xvi) chelate-denatured epoxy resins such as ADEKA RESIN EP-49-10 and ADEKA RESIN EP-49-20 (trade names) manufactured by ADEKA Corporation, and (xvii) heterocycle-containing epoxy resins such as TEPIC (trade name) manufactured by Nissan Chemical Industries, Ltd.

The insulating film according to the present invention includes a curing agent for the above thermosetting resin. The curing agent is not particularly limited to any specific one. Examples of the curing agent include: a phenolic resin such as phenol novolac resin, cresol novolac resin, and naphthalene type phenolic resin; amino resin; urea resin; melamine; and dicyandiamide. These curing agents can be used solely, or two or more types thereof can be used in combination.

A curing accelerator for use is not particularly limited to any specific one. Examples of the curing accelerator include: phosphine-based compounds such as triphenylphosphine; amine-based compounds such as tertiary amine, trimethanolamine, triethanolamine, and tetraethanolamine; borate-based compounds such as 1,8-diaza-bicyclo[5,4,0]-7-undecenium tetraphenylborate; imidazoles such as imidazole, 2-ethyl imidazole, 2-ethyl-4-methyl imidazole, 2-phenyl imidazole, 2-undecyl imidazole, 1-benzyl-2-methyl imidazole, 2-heptadecylimidazole, 2-isopropyl imidazole, 2,4-dimethyl imidazole, and 2-phenyl-4-methyl imidazole; imidazolines such as 2-methyl imidazoline, 2-ethyl imidazoline, 2-isopropyl imidazoline, 2-phenyl imidazoline, 2-undecylimidazoline, 2,4-dimethyl imidazoline, and 2-phenyl-4-methyl imidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-diamino-6-[2'-ethyl-4'-methylimidazolyl-(1')]-ethyl-s-triazine. These curing accelerators can be used solely, or two or more types thereof can be used in combination.

<(E) Photopolymerization Initiator>

The (E) photopolymerization initiator according to the present invention is a compound that is activated by energy such as UV energy and that starts and accelerates a reaction of a radically polymerizable group.

An insulating film containing the (E) photopolymerization initiator, according to the present invention, is an insulating film including a resin composition containing the component (E).

Containing the component (E) in the insulating film according to the present invention can impart excellent photosensitivity to the insulating film. This makes it possible to accelerate a curing reaction by irradiating the insulating film with ultraviolet light, thus improving microfabrication and chemical resistance of the insulating film.

The component (E) is not particularly limited to any specific one as long as it has the above structure. Examples of the component (E) include: Michler's ketone; 4,4'-bis(diethylamino)benzophenone; 4,4',4"-tris(dimethylamino)triphenylmethane; 2,2'-bis(2-chlorophenyl)-4,4',5,5'-tetraphenyl-1,2'-diimidazole; acetophenone; benzoin; 2-methylbenzoin; benzoin methyl ether; benzoin ethyl ether; benzoin isopropyl ether; benzoin isobutyl ether; 2-t-butylanthraquinone; 1,2-benzo-9,10-anthraquinone; methylanthraquinone; thioxanthone; 2,4-diethylthioxanthone; 2-isopropylthioxanthone; 1-hydroxycyclohexyl phenyl ketone; diacetylbenzyl; benzyl dimethyl ketal; benzyl diethyl ketal; 2(2'-furilethylidene)-4,6-bis(trichloromethyl)-S-triazine; 2[2'(5"-methylfuril)ethylidene]-4,6-bis(trichloromethyl)-S-triazine; 2(p-methoxyphenyl)-4,6-bis(trichloromethyl)-S-triazine; 2,6-di(p-azidobenzal)-4-methylcyclohexanone; 4,4'-diazidochalcon; di(tetraalkylammonium)-4,4'-diazidostilbene-2,2'-disulfonate; 2,2-dimethoxy-1,2-diphenylethane-1-one; 1-hydroxy-cyclohexyl-phenyl-ketone; 2-hydroxy-2-methyl-1-phenyl-propane-1-one; 1-[4-(2-hydroxyethoxy)-phenyl]-2-hydroxy-2-methyl-1-propane-1-one; 2-methyl-1-[4-(methylthio)phenyl]-2-morpholinopropane-1-one; 2-benzyl-2-dimethylamino-1-(4-morpholinophenyl)-butane-1-one; bis(2,4,6-trimethylbenzoyl)-phenylphosphine oxide; bis(2,6-dimethoxybenzoyl)-2,4,4-trimethyl-pentylphosphine oxide; 2,4,6-trimethylbenzoyl-diphenyl-phosphine oxide; 2-hydroxy-2-methyl-1-phenyl-propane-1-ketone; bis(n5-2,4-cyclopentadiene-1-yl)-bis(2,6-difluoro-3-(1H-pyrrole-1-yl)-phenyl)titanium; 1,2-octanonedione; 1-[4-(phenylthio)-,2-(O-benzoyloxime)]; iodonium; (4-methylphenyl)[4-(2-methylpropyl)phenyl]-hexafluorophosphate(1-); ethyl-4-dimethylaminobenzoate; 2-ethylhexyl-4-dimethylaminobenzoate; ethanone; and 1-[9-ethyl-6-(2-methylbenzoyl)-9H-carbazol-3-yl]-,1-(O-acetyloxime). These compounds can be used solely, or two or more types thereof can be used in combination.

<Other Components>

The insulating film according to the present invention can further include, as needed, any of various additives such as a radically polymerizable compound, a filler, an adhesive auxiliary agent, a defoaming agent, a leveling agent, a coloring agent, and a polymerization inhibitor.

The above radically polymerizable compound is a compound containing, in its molecule, a radically polymerizable group of which a polymerization reaction proceeds with use of a radical polymerization initiator. The radically polymerizable compound is, in particular, preferably a resin containing at least one unsaturated double bond in its molecule. Further, the unsaturated double bond is preferably a (meth) acryloyl group or a vinyl group.

Examples of the above radically polymerizable compound include: bisphenol F EO-denatured (n=2 to 50) diacrylate; bisphenol A EO-denatured (n=2 to 50) diacrylate; bisphenol S EO-denatured (n=2 to 50) diacrylate; bisphenol F EO-denatured (n=2 to 50) dimethacrylate; bisphenol A EO-denatured (n=2 to 50) dimethacrylate; bisphenol S EO-denatured (n=2 to 50) dimethacrylate; 1,6-hexanediol diacrylate; neopentyl glycol diacrylate; ethylene glycol diacrylate; pentaerythritol diacrylate; trimethylolpropane triacrylate; pentaerythritol triacrylate; dipentaerythritol hexaacyrlate; tetramethylolpropane tetraacrylate; tetraethylene glycol diacrylate; 1,6-hexanediol dimethacrylate; neopentyl glycol dimethacrylate; ethylene glycol dimethacrylate; pentaerythritol dimethacrylate; trimethylolpropane trimethacrylate; pentaerythritol trimethacrylate; dipentaerythritol hexamethacrylate; tetramethylolpropane tetramethacrylate; tetraethylene glycol dimethacrylate; methoxy diethylene glycol methacrylate; methoxy polyethylene glycol methacrylate; β-methacryloyloxyethyl hydrogen phthalate; β-methacryloyloxyethyl hydrogen succinate; 3-chloro-2-hydroxypropyl methacrylate; stearyl methacrylate; phenoxyethyl acrylate; phenoxydiethylene glycol acrylate; phenoxypolyethylene glycol acrylate; β-acryloyloxyethyl hydrogen succinate; lauryl acrylate; ethylene glycol dimethacrylate; diethylene glycol dimethacrylate; triethylene glycol dimethacrylate; polyethylene glycol dimethacrylate; 1,3-butylene glycol dimethacrylate; 1,6-hexanediol dimethacrylate; neopentyl glycol dimethacrylate; polypropylene glycol dimethacrylate; 2-hydroxy-1,3-dimethacryloxypropane; 2,2-bis[4-(methacryloxyethoxy)phenyl]propane; 2,2-bis[4-(methacryloxy diethoxy)phenyl]propane; 2,2-bis[4-(methacryloxy polyethoxy)phenyl]propane; polyethylene glycol diacrylate; tripropylene glycol diacrylate; polypropylene glycol diacrylate; 2,2-bis[4-(acryloxy diethoxy)phenyl]propane; 2,2-bis[4-(acryloxy polyethoxy)phenyl]propane; 2-hydroxy-1-acryloxy-3-methacryloxypropane; trimethylolpropane trimethacrylate; tetramethylolmethane triacrylate; tetramethylolmethane tetraacrylate; methoxydipropylene glycol methacrylate; methoxytriethylene glycol acrylate; nonylphenoxypolyethylene glycol acrylate; nonylphenoxypolypropylene glycol acrylate; 1-acryloyloxypropyl-2-phthalate; isostearyl acrylate; polyoxyethylenealkyl ether acrylate; nonylphenoxyethylene glycol acrylate; polypropylene glycol dimethacrylate; 1,4-butanediol dimethacrylate; 3-methyl-1,5-pentanediol dimethacrylate; 1,6-mexanediol dimethacrylate; 1,9-nonanediol methacrylate; 2,4-diethyl-1,5-pentanediol dimethacrylate; 1,4-cyclohexane dimethanol dimethacrylate; dipropylene glycol diacrylate; tricyclodecane dimethanol diacrylate; 2,2-hydrogenated bis[4-(acryloxy polyethoxy)phenyl]propane; 2,2-bis[4-(acryloxy polypropoxy)phenyl]propane; 2,4-diethyl-1,5-pentanediol diacrylate; ethoxylated trimethylolpropane triacrylate; propoxylated trimethylolpropane triacrylate; isocyanuric acid tri (ethane acrylate); pentaerythritol tetraacrylate; ethoxylated pentaerythritol tetraacrylate; propoxylated pentaerythritol tetraacrylate; ditrimethylolpropane tetraacrylate; dipentaerythritol polyacrylate; triallyl isocyanurate; glycidyl methacrylate; glycidyl allyl ether; 1,3,5-triacryloylhexahydro-s-triazine; triallyl 1,3-5-benzenecarboxylate; triallylamine; triallyl citrate; triallyl phosphate; allobarbital; diallylamine; diallyl dimethyl silane; diallyl disulfide; diallyl ether; diallyl cyanurate; diallyl isophthalate; diallyl terephthalate; 1,3-diallyloxy-2-propanol; diallyl sulfide diallyl maleate; 4,4'-isopropylidene diphenol dimethacrylate; and 4,4'-isopropylidene diphenol diacrylate. These compounds can be used solely, or two or more types thereof can be used in combination. Preferably, the radically polymerizable compound is, in particular, a compound containing 2 to 50 mol of a repeating unit of EO (ethylene oxide) included in a single molecule of diacrylate or dimethacrylate. This arrangement (i) improves solubility of the photosensitive resin composition in an aqueous developing solution (which is typically represented by an alkaline aqueous solution) and (ii) reduces the developing time.

The above filler can be a fine inorganic filler of, for example, silica, mica, talc, barium sulfate, wollastonite, or calcium carbonate.

Examples of the above defoaming agent include an acryl-based compound, a vinyl-based compound, and a butadiene-based compound.

Examples of the above leveling agent include an acryl-based compound and a vinyl-based compound.

Examples of the above coloring agent include a phthalocyanine-based compound, an azo-based compound, and carbon black.

Examples of the above adhesive auxiliary agent (referred to also as "tackifier") include a silane coupling agent, a triazole-based compound, a tetrazole-based compound, and a triazine-based compound.

Examples of the above polymerization inhibitor include hydroquinone and hydroquinone monomethylether.

The insulating film according to the present invention, which includes the (C) fine particles containing at least one element selected from the group consisting of phosphorus, aluminum, and magnesium, has excellent flame retardancy. The insulating film may, however, further include another flame retardant for greater flame retardancy. Such a flame retardant is, for example, a halogen-based compound, a phosphorus-based compound, or a melamine-based compound. The above various additives can be used solely, or two or more types thereof can be used in combination.

<How Component (B) and Component (C) are Dispersed in Insulating Film>

The component (B) and component (C), according to the present invention, being dispersed in the insulating film refers to the state of, on a cross section of the insulating film which cross section is cut along the thickness direction of the insulating film, (i) the (B) spherical organic beads being each independently observed as a spherical or elliptical region and (ii) the (C) fine particles being each independently observed as an indefinitely shaped, circular or polygonal region. Preferably, (i) the (B) spherical organic beads are observed independently of one another, (ii) the (C) fine particles are observed independently of one another, and (iii) the (B) spherical organic beads and the (C) fine particles are observed independently of each other. Alternatively, as long as the advantageous effects of the present invention are not impaired, (i) the (B) spherical organic beads may be observed as being adjacent to one another, (ii) the (C) fine particles may be observed as being adjacent to one another, and (iii) the (B) spherical organic beads and the (C) fine particles may be observed as being adjacent to each other. The expression "as long as the advantageous effects of the present invention are not impaired" refers to the range within which (i) a total length of adjacent component (B) regions, (ii) a total length of adjacent component (C) regions, and (iii) a total length of adjacent component (B) and component (C) regions are each not larger than the thickness of the insulating film on an imaginary line drawn on a cross section of the insulating film which cross section is cut along the thickness direction of the insulating film, the imaginary line extending from an arbitrary point of a surface of the insulating film to a surface of a base material so as to be orthogonal to the surface of the base material.

The insulating film according to the present invention includes the component (B) and the component (C) dispersed therein. This arrangement allows irregularities to be effectively formed at a surface of the insulating film produced, thus allowing the insulating film to have excellent tack-free property. The above arrangement also allows the component (B) to produce a filling effect, thus decreasing warpage of the insulating film. The above arrangement further improves, for example, a stress relaxing effect and fracture toughness of the insulating film, thus improving flexibility of being able to resist repeated foldings. The insulating film according to the present invention contains the component (C), which (i) can impart excellent flame retardancy to the insulating film, (ii) is present as a filler component inside the insulating film and thus causes no decrease in heat resistance or electrical insulation reliability of the insulating film, and (iii) causes no bleedout from the insulating film and can thus prevent, for example, (a) a contact fault at a component mounting section and (b) pollution and contamination during a step of processing the insulating film.

With reference to FIG. 1, the description below deals with the dispersion of the component (B) and component (C) according to the present invention in the insulating film. An insulating film 1 is, as illustrated in FIG. 1, arranged to contain, present in a cross section of the insulating film 1 which cross section is cut along the thickness direction of the insulating film 1, (i) a continuous phase 2, (ii) a dispersion phase 3, which is made of the component (B) and which includes spherical or elliptical regions independent of one another, and (iii) a dispersion phase 4, which is made of the component (C) and which includes indefinitely shaped, circular or polygonal regions independent of one another. The phrase "cross section of the insulating film which cross section is cut along the thickness direction of the insulating film" refers to a surface that is cut, in the case where the insulating film is provided on a base material 5 such as a printed wiring board, along an axis direction extending in the direction of the base material from a surface of the insulating film.

The dispersion of the component (B) and component (C) according to the present invention in the insulating film can be determined by any method. An example method is a method of, as described below, (i) molding, in a thermosetting resin, a printed wiring board including the insulating film, (ii) polishing, with use of an ion beam, a cross section of the insulating film which cross section is cut along the thickness direction of the insulating film, and (iii) observing the cross section of the insulating film under a scanning electron microscope.

(Cross Section Exposure of Insulating Film)

This example method, in the case where the insulating film was provided on a base material such as a printed wiring board, (i) cut out a 5 mm×3 mm region with use of a box cutter, (ii) formed a protective film layer and a cover glass layer with use of an epoxy-based molding resin and a cover glass respectively on each surface of the above cut-out laminate, that is, a surface on the insulating film side and a surface on the base material side, and (iii) performed, with use of an ion beam, a process of cross section polisher on a cross section of the insulating film which cross section was cut along the thickness direction of the insulating film.

(Process of Cross Section Polisher)

Apparatus used: equivalent of SM-09020CP manufactured by JEOL Ltd.

Processing condition: acceleration voltage of 6 kV (Observation of Cross Section of Insulating Film)

This example method observed, under a scanning electron microscope, the above-formed cross section of the insulating film which cross section was cut along the thickness direction of the insulating film.

(Observation Under Scanning Electron Microscope)

Apparatus used: equivalent of S-3000N manufactured by Hitachi High-Technologies Corporation Observation condition: acceleration voltage of 15 kV Detector: detection of reflected electrons (composition mode)

Magnification: 1000

The detection of reflected electrons (composition mode), which detection was used in this method, causes contrast to strongly reflect the difference between respective average atomic numbers in observation regions, and thus allows (i) a region in which a heavy element is present to be observed as bright (white) and (ii) a region in which a light element is present to be observed as dark (black). Consequently, the detection of reflected electrons allows (i) dark (black), circular regions to be observed in correspondence with the (B) spherical organic beads, which are made of organic matter of comparatively light elements such as carbon, hydrogen, oxygen, and nitrogen and (ii) dim (gray) or bright (white), circular or polygonal regions to be observed in correspondence with the (C) fine particles, which are indefinite in shape and which contain at least one element selected from the group consisting of phosphorus, aluminum, and magnesium, which are comparatively heavy elements.

The component (B) having a urethane bond in its molecule can be determined by (i) analyzing, by an infrared absorption microspectrometry (μIR) similar to that used for the component (A), component (B) regions in a cross section of the insulating film which cross section is cut along the thickness direction of the insulating film and (ii) determining whether a spectrum derived from stretching vibration between C=O in a urethane bond is present within or near a range of 1715 to 1730 $cm^{-1}$.

Further, information on the element contained in the component (C) can be obtained by analyzing, with use of a scanning electron microscopline X-ray microanalyzer (SEM-EPMA), component (C) regions in a cross section of the insulating film which cross section is cut along the thickness direction of the insulating film. This makes it possible to determine that the component (C) contains at least one element selected from the group consisting of phosphorus, aluminum, and magnesium.

(Analysis with Use of Scanning Electron Microscopline X-Ray Microanalyzer)

Apparatus used: equivalent of EMAX-7000 manufactured by Horiba, Ltd.

Analysis condition: acceleration voltage of 15 kV and integration time period of 900 seconds How the component (B) and the component (C) are dispersed in the insulating film in accordance with the present invention may simply be determined by performing, in order to prevent a measurement deviation and abnormal detection, three measurements at positions different from one another, each of which measurements (i) sets an arbitrary point, (ii)

measures the dispersion, starting from the arbitrary point, at 10 points located at 5-μm intervals, (iii) omits the maximum and minimum values from the measured values, and (iv) averaging the remaining values to find a measurement value.

<Area Occupied by Component (B) in Cross Section of Insulating Film which Cross Section is Cut Along Thickness Direction of Insulating Film>

Any method can be used to measure the area occupied by the component (B) in any 125 μm×15 μm region of a cross section of the insulating film of the present invention which cross section is cut along the thickness direction of the insulating film. An example method is a method of measuring, as the area occupied by the component (B), the sum total of respective areas of all component (B) regions that are observed, in the method for determining the dispersion of the component (B) and the component (C) in the insulating film, in any 125 μm×15 μm region of the insulating film portion in a scanning electron microscopic image.

For instance, in the case where a component (B) region is circular, the area (S1) of the component (B) region may simply be measured by a method of (i) measuring the radius (r1) of the component (B) region and (ii) solving the following equation to find the area:

$$S1=3.14*(r1)^2.$$

In the case where a component (B) region is elliptical, the area (S2) of the component (B) region may simply be measured by a method of (i) actually measuring the maximum length (a) and minimum length (b) of the component (B) region along an axis extending through the center of the component (B) region and (ii) solving the following equation to find the area:

$$S2=3.14*(a/2)*(b/2).$$

In the case where less than half of a component (B) region is partially in the 125 μm×15 μm region, the area (S3) of the component (B) region may simply be measured by a method of (i) measuring the radius (r2) of the component (B) region, which radius (r2) is the distance from (a) the vertex (that is, the center point of the curve portion) of the semicircular portion of the component (B) region, the semicircular portion being in the 125 μm×15 μm region, to (b) the center of the entire component (B) region including the portion beyond the 125 μm×15 μm region, (ii) measuring a length (c) calculated by subtracting, from the radius (r2), a portion of an imaginary straight line for use in measuring the above radius which portion is in the 125 μm×15 μm region, and (iii) solving the following equation to find the area:

$$S3=(r2)^2*\mathrm{Arccos}(c/r2)-c*\sqrt{\{(r2)^2-c^2\}}.$$

In the case where more than half of a component (B) region is partially in the 125 μm×15 μm region, the area (S4) of the component (B) region may simply be measured by a method of (i) measuring the radius (r3) of the component (B) region, which radius (r3) is the distance from (a) the vertex (that is, the center point of the curve portion) of the semicircular portion of the component (B) region, the semicircular portion being beyond the 125 μm×15 μm region, to (b) the center of the entire component (B) region including the portion in the 125 μm×15 μm region, (ii) measuring a length (d) calculated by subtracting, from the radius (r3), a portion of an imaginary straight line for use in measuring the above radius which portion is beyond the 125 μm×15 μm region, and (iii) solving the following equation to find the area:

$$S4=3.14*(r3)^2-[(r3)^2*\mathrm{Arccos}(d/r3)-d*\sqrt{\{(r3)^2-d^2\}}].$$

The area of the component (B), the area being measured by any of the above methods, needs to occupy a 20% to 50% area of the 125 μm×15 μm region of the cross section of the insulating film which cross section is cut along the thickness direction of the insulating film. Occupying a 20% to 50% area as such allows irregularities to be effectively formed at a surface of the insulating film, thus allowing the insulating film to have excellent tack-free property. The above arrangement also allows the component (B) to produce a filling effect, thus decreasing warpage of the insulating film. The above arrangement further improves, for example, a stress relaxing effect and fracture toughness of the insulating film, thus improving flexibility of being able to resist repeated foldings. The component (B) occupying an area of smaller than 20% may cause a decrease in tack-free property and/or flexibility of being able to resist repeated foldings. The component (B) occupying an area of larger than 50% may (i) cause a decrease in flame retardancy and/or ease of coating with a resin composition solution for forming the insulating film, and consequently (ii) cause foaming of a coating film during coating and/or an appearance defect due to insufficient leveling.

The component (B) may have, in the 125 μm×15 μm region of the cross section of the insulating film which cross section is cut along the thickness direction of the insulating film, an area at a proportion that, in the case where three measurements are performed at positions different from one another to prevent a measurement deviation and abnormal detection, occupies a 20% to 50% area in at least one or all of the three measurements.

In order for the (B) spherical organic beads to occupy a 20% to 50% area of the 125 μm×15 μm region of the cross section of the insulating film of the present invention which cross section is cut along the thickness direction of the insulating film, a preferable method to use is, for example, a method of containing the component (B) at an amount that is 30 to 100 parts by weight with respect to 100 parts by weight of the (A) binder polymer.

(II) Method for Forming Insulating Film

The insulating film of the present invention can be produced by (i) mixing the components (A) to (C) and, as needed, the components (D) and (E) and other components to obtain a resin composition, (ii) applying the resin composition onto a base material, (iii) drying the resin composition, (iv) forming a fine opening as needed by exposure and development, and (v) performing a heat treatment on the resulting product.

The above mixing is not particularly limited in terms of its method. The mixing is, for example, performed with use of a general kneading machine such as a triple roll mill, a beads mill, and a ball mill. A triple roll mill in particular, among those kneading machines, is preferable because grinding and dispersing the above components for mixture with use of a triple roll mill allows the (C) fine particles to be uniform in size. The respective particle diameters of the individual components in the resin composition as mixed can be measured by a method involving a gauge according to JIS K 5600-2-5. Further, use of a particle size distribution measuring device allows measurement of an average particle diameter, a particle diameter, and a particle size distribution.

The following method can then be used to produce a cured film with use of the resin composition produced as above: The above resin composition is first applied onto a base material and dried. The application onto a base material can be performed by, for example, screen printing, curtain rolling, reverse rolling, spray coating, or rotational application involving a spinner. The film as applied (preferably having a thickness of 5 μm to 100 μm or particularly preferably having a thickness of 10 µm to 100 µm) is dried at a temperature of not higher than 120° C. or preferably at a temperature of 40° C. to 100° C.

Then, after the applied film is dried as needed, a negative photomask is placed on the applied film thus dried, and the applied film is irradiated with active light such as an ultraviolet ray, a visible ray, and an electron beam for exposure. Then, a portion of the applied film which portion is not exposed to light is developed with use of a developing solution by a method such as a shower method, a paddle method, a soaking method, and an ultrasonic method so as to form a fine opening. Since the time required for the fine opening to be exposed differs depending on (i) spray pressure and flow speed of the developing device used and (ii) a temperature of the etchant used, it is desirable to find an optimum condition for the device as appropriate.

As the developing solution, an alkaline aqueous solution is preferably used. The developing solution may contain a water-soluble organic solvent such as methanol, ethanol, n-propanol, isopropanol, and N-methyl-2-pyrrolidone. Examples of alkaline compounds used for preparing the alkaline aqueous solution include hydroxides, carbonates, hydrogencarbonates, and amine compounds of alkaline metals, alkaline earth metals, and ammonium ion. More specifically, examples of the alkaline compounds include sodium hydroxide, potassium hydroxide, ammonium hydroxide, sodium carbonate, potassium carbonate, ammonium carbonate, sodium hydrogencarbonate, potassium hydrogencarbonate, ammonium hydrogencarbonate, tetramethylammonium hydroxide, tetraethylammonium hydroxide, tetrapropylammonium hydroxide, tetraisopropylammonium hydroxide, N-methyldiethanolamine, N-ethyldiethanolamine, N,N-dimethylethanolamine, triethanolamine, triisopropanolamine, and triisopropylamine. Further, any other compounds are obviously usable as long as the aqueous solution exhibits basicity. The developing solution has a temperature that depends on, for example, the composition of the resin composition or the composition of the alkaline developing solution. The developing solution, when used, generally has a temperature of not lower than 0° C. and not higher than 80° C., or more generally has a temperature of preferably not lower than 10° C. and not higher than 60° C.

The fine opening formed in the developing step is rinsed to remove unnecessary residues. Examples of a rinsing fluid used for the rinse include water and an acidic aqueous solution.

The resulting film is then heat-treated. Performing a heat treatment as such allows production of a cured film that is excellent in heat resistance and chemical resistance. The cured film has a thickness that is determined with the thickness of the base material and the like in consideration. The cured film preferably has a thickness of approximately 2 µm to 50 µm. The heat treatment has, in order to prevent (i) oxidation of wiring lines and the like and (ii) a decrease in adhesiveness with respect to the base material, a final temperature of preferably not lower than 100° C. and not higher than 250° C., more preferably not lower than 120° C. and not higher than 200° C., or particularly preferably not lower than 130° C. and not higher than 180° C. A high temperature during the heat treatment may (i) accelerate oxidation of wiring lines and the like and/or (ii) decrease adhesiveness with respect to the base material.

The insulating film of the present invention is excellent in flexibility of being able to resist repeated foldings, flame retardancy, and electrical insulation reliability, and has reduced warpage. The insulating film is thus particularly suitable as an insulating film for a flexible substrate. The insulating film is further used for any of various wiring line coating protective agents, heat-resistant adhesives, and electric wire/cable insulating coatings.

(2. Second Aspect of Invention of Present Application)

The description below deals in detail with first (I) an insulating film and then (II) a method for forming an insulating film in accordance with a second aspect of the present invention.

(I) Insulating Film

The insulating film according to the present invention is a film having an insulating property, and is preferably a film having a thickness of 5 µm to 50 µm.

The thickness of the insulating film according to the present invention can be measured by any method. The thickness can be measured by, for example, a method being in conformity with JIS K 5400 3.5. Controlling the thickness within the above range is preferable because the thickness controlled as such allows the insulating film to be excellent in flexibility and electrical insulation reliability. A thickness of lower than 5 µm may decrease the electrical insulation reliability of the insulating film, whereas a thickness of higher than 50 µm may decrease the flexibility of the insulating film.

The inventor of the present invention has found that the insulating film of the present invention has various excellent properties, and presumes that it is for the following reason; the insulating film of the present invention is arranged to include fine particles dispersed therein. With this arrangement, the insulating film has irregularities formed at its surface as well and thus has excellent tack-free property. Since the insulating film contains a (A) compound having a urethane bond in its molecule, the insulating film has excellent flexibility due to a flexible skeleton derived from the urethane bond. In the case where the above fine particles are (B) spherical organic beads, such fine particles are, (i) because they are spherical beads, unlikely to aggregate inside the insulating film and, (ii) because they are organic matter, excellent in affinity for the insulating film serving as a matrix. This eliminates the possibility of a decrease in mechanical strength of the insulating film. In the case where the above fine particles are (C) fine particles containing elemental phosphorus, such fine particles (i) can impart excellent flame retardancy to the insulating film, (ii) are present as a filler component inside the insulating film and thus cause no decrease in heat resistance or electrical insulation reliability of the insulating film, and (iii) cause no bleedout from the insulating film and can thus prevent, for example, (a) a contact fault at a component mounting section and (b) pollution and contamination during a step of processing the insulating film. The (B) spherical organic beads are such that a total length of the (B) spherical organic beads makes up 20% to 80% of the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material. This arrangement allows irregularities to be effectively formed at a surface of the insulating film, thus allowing the insulating film to have particularly excellent tack-free property. The above arrangement also allows the component (B) to produce a filling effect, thus decreasing warpage of the insulating film. The above arrangement further allows the component (B) to improve, for example, a stress relaxing effect and fracture toughness of the insulating film, thus improving flexibility of being able to resist repeated foldings. Containing a filler component at a high proportion will generally decrease flexibility of resisting repeated foldings.

However, the above arrangement causes the component (A) to seep into the component (B) through its surface, and thus achieves high adhesiveness at an interface between the component (A) and the component (B). Consequently, as the inventor presumes, the present invention can surprisingly provide an insulating film so flexible as to be able to resist repeated foldings even in the case where the (B) spherical organic beads are contained at such a high proportion that a total length of the (B) spherical organic beads makes up 20% to 80% of the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material.

The description below deals with a (A) compound having a urethane bond in its molecule, (B) spherical organic beads, (C) fine particles containing elemental phosphorus, a (D) thermosetting resin, a (E) photopolymerization initiator, other components, how the component (B) and the component (C) are dispersed in the insulating film, and the proportion of a total length of component (B) regions with respect to the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material.

<(A) Compound Having Urethane Bond in Molecule>

The (A) compound having a urethane bond in its molecule in accordance with the present invention is an organic compound having at least one urethane bond in its molecule.

Whether the insulating film according to the present invention contains the component (A) can be determined by any method. An example method is a method of (i) scraping off several micrometers of a surface of the insulating film with use of an oblique-cutting apparatus or the like, (ii) analyzing a continuous phase of the obtained slice of the insulating film by an infrared absorption microspectrometry (μIR), and (iii) determining whether a spectrum derived from stretching vibration between C=O in a urethane bond is present within or near a range of 1715 to 1730 cm$^{-1}$. The oblique-cutting apparatus is identical to that described in (1. First Aspect of Invention of Present Application) above, and is thus not described here.

The above method can achieve improved determination accuracy in the case where it is combined with a method of (i) performing pyrolysis gas chromatography/mass spectroscopy (PyGC/MS) on the obtained slice of the insulating film, (ii) searching a library for a detected peak of the MS spectrum to qualitatively determine a component, and (iii) determining whether there is present a peak derived from a diisocyanate compound, which is a raw material for forming a urethane bond. The pyrolysis gas chromatography/mass spectroscopy is also identical to that described in (1. First Aspect of Invention of Present Application) above, and is thus not described here.

The component (A) according to the present invention can be produced through any reaction. The compound (A) can be produced by, for example, reacting (i) a diol compound represented by General Formula (1):

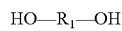  General Formula (1)

where $R_1$ represents a divalent organic group, with (ii) a diisocyanate compound represented by General Formula (2):

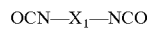  General Formula (2)

where $X_1$ represents a divalent organic group, into a structure containing a repeating unit that has a urethane bond represented by General Formula (3):

General Formula (3)

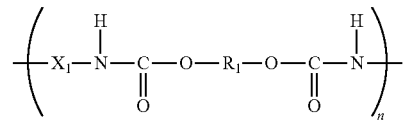

where $R_1$ and $X_1$ each independently represent a divalent organic group, and n represents an integer of 1 or more.

The diol compound of the present invention is not particularly limited to any specific one as long as it has the above structure. Examples of the diol compound include those listed as examples of the diol compound in (1. First Aspect of Invention of Present Application) above. Those compounds can be used solely, or two or more types thereof can be used in combination.

The diisocyanate compound of the present invention is not particularly limited to any specific one as long as it has the above structure. Examples of the diisocyanate compound include those listed as examples of the diisocyanate compound in (1. First Aspect of Invention of Present Application) above. Those compounds can be used solely, or two or more types thereof can be used in combination.

The (A) compound having a urethane bond in its molecule in accordance with the present invention may further contain at least one organic group selected from the group consisting of a (a1) (meth)acryloyl group, a (a2) carboxyl group, and a (a3) imide group. The term "(a1) (meth)acryloyl group" refers to an acryloyl group and/or a methacryloyl group. With the (A) compound containing the (a1) (meth)acryloyl group, in the case where the insulating film is made of a photosensitive resin composition, the (a1) (meth)acryloyl group improves photosensitivity, and thus allows the insulating film to be cured by ultraviolet irradiation performed over a short time period. With the (A) compound containing the (a2) carboxyl group, in the case where the insulating film includes a thermosetting resin, the carboxyl group reacts with the thermosetting resin, the reaction allowing the insulating film to be improved in, for example, (i) heat resistance and (ii) electrical insulation reliability at high temperature and high humidity. Further, containing the (a3) imide group in the (A) compound allows the insulating film to be improved in, for example, (i) heat resistance, (ii) flame retardancy, and (iii) electrical insulation reliability at high temperature and high humidity.

The component (A) containing the (a1) (meth)acryloyl group can be produced through any reaction. Such a component (A) can be produced by, for example, reacting, in addition to the diol compound and the diisocyanate compound, (i) a compound containing a hydroxy group and at least one (meth)acryloyl group, the compound being represented by General Formula (4):

General Formula (4)

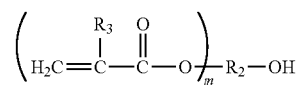

where $R_2$ represents an organic group having a valence of m+1, $R_3$ represents a hydrogen or an alkyl group, and m represents an integer of 1 to 3, and/or (ii) a compound containing an isocyanate group and at least one (meth)acryloyl group, the compound being represented by General Formula (5):

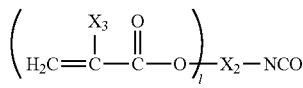

General Formula (5)

where $X_2$ represents an organic group having a valence of 1+1, $X_3$ represents a hydrogen or an alkyl group, and 1 represents an integer of 1 to 3.

The compound containing a hydroxy group and at least one (meth)acryloyl group in accordance with the present invention is not particularly limited to any specific one as long as it has the above structure. Examples of the compound include those listed as examples of the compound containing a hydroxy group and at least one (meth)acryloyl group in (1. First Aspect of Invention of Present Application) above. Those compounds can be used solely, or two or more types thereof can be used in combination.

The compound containing an isocyanate group and at least one (meth)acryloyl group in accordance with the present invention is not particularly limited to any specific one as long as it has the above structure. Examples of the compound include: 2-(meth)acryloyloxyethyl isocyanate; 1,1-(bisacryloyloxymethy) ethyl isocyanate; and 2-(2-methacryloyloxyethyl oxy) ethyl isocyanate. These compounds can be used solely, or two or more types thereof can be used in combination.

The component (A) containing the (a2) carboxyl group can be produced through any reaction. Such a component (A) can be produced by, for example, reacting, in addition to the diol compound and the diisocyanate compound, a compound containing two hydroxy groups and one carboxyl group, the compound being represented by General Formula (6):

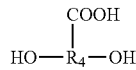

General Formula (6)

where $R_4$ represents a trivalent organic group.

The compound containing two hydroxy groups and one carboxyl group in accordance with the present invention is not particularly limited to any specific one as long as it has the above structure. Examples of the compound include those listed as examples of the compound containing two hydroxy groups and one carboxyl group in (1. First Aspect of Invention of Present Application) above. Those compounds can be used solely, or two or more types thereof can be used in combination.

The component (A) containing the (a3) imide group can be produced through any reaction. Such a component (A) can be produced by, for example, reacting, in addition to the diol compound and the diisocyanate compound, a tetracarboxylic acid dianhydride represented by General Formula (7):

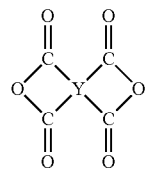

General Formula (7)

where Y represents a tetravalent organic group.

The tetracarboxylic acid dianhydride of the present invention is not particularly limited to any specific one as long as it has the above structure. Examples of the tetracarboxylic acid dianhydride include those listed as examples of the tetracarboxylic acid dianhydride in (1. First Aspect of Invention of Present Application) above. Those compounds can be used solely, or two or more types thereof can be used in combination.

The compound having a urethane bond in its molecule in accordance with the present invention is synthesized by, for example, a method of (i) mixing the diol compound with the diisocyanate compound in such respective amounts that isocyanate groups and hydroxy groups are contained at a number ratio of isocyanate groups/hydroxy groups of not smaller than 0.5 and not larger than 2.0, and (ii) reacting the mixture without any solvent or in an organic solvent.

Further, in the case where two or more types of the diol compound are used, (i) the reaction thereof with the diisocyanate compound may be performed after the two or more types of the diol compound are mixed, or (ii) each of the two or more types of the diol compound may be reacted with the diisocyanate compound independently. Alternatively, the reaction may be performed such that (i) a diol compound is initially reacted with the diisocyanate compound, (ii) the resultant terminal isocyanate compound is reacted with another diol compound, and (iii) a reactant is further reacted with the diisocyanate compound. Further, in the case where two or more types of the diisocyanate compound are used, the reaction can be performed in the same manner as above. In this way, an intended (A) compound having a urethane bond in its molecule can be prepared.

The reaction between the diol compound and the diisocyanate compound is performed at a temperature of preferably (i) 40° C. to 160° C., or more preferably (ii) 60° C. to 150° C. If the temperature is less than 40° C., the reaction takes too much time. If the temperature exceeds 160° C., a three-dimensional reaction occurs during the reaction, which easily causes gelatinization. How long the reaction is performed can be determined as appropriate depending on a batch scale and a reaction condition to be used. Further, the reaction may optionally be performed in the presence of a catalyst such as (i) a tertiary amine or (ii) a metal compound or semi-metal compound (for example, alkaline metal, alkaline earth metal, tin, zinc, titanium, or cobalt).

The above reaction, which can be performed without any solvent, is desirably performed with an organic solvent system for the sake of better control of the reaction. Examples of the organic solvent include sulfoxide-based solvents such as dimethyl sulfoxide and diethyl sulfoxide; formamide-based solvents such as N,N-dimethyl formamide and N,N-diethyl formamide; acetamide-based solvents such as N,N-dimethylacetamide and N,N-diethylacetamide; pyrrolidone-based solvents such as N-methyl-2-pyrrolidone and N-vinyl-2-pyrrolidone; hexamethylphosphoramide; and γ-butyrolactone.

Further, these organic solvents can be used optionally in combination with an aromatic hydrocarbon such as xylene or toluene, as needed.

Further examples of the organic solvent include: solvents of symmetric glycol diethers such as methyl monoglyme (1,2-dimethoxyethane), methyl diglyme (bis(2-methoxyethyl)ether), methyl triglyme (1,2-bis(2-methoxyethoxy)ethane), methyl tetraglyme (bis[2-(2-methoxyethoxyethyl)]ether), ethyl monoglyme (1,2-diethoxyethane), ethyl diglyme (bis(2-ethoxyethyl)ether), and butyl diglyme (bis(2-butoxyethyl)ether); solvents of acetates such as methyl acetate, ethyl acetate, isopropyl acetate, n-propyl acetate, butyl acetate, propylene glycol monomethyl ether acetate, ethylene glycol monobutyl ether acetate, diethylene glycol monoethyl ether acetate (another name: carbitol acetate, 2-(2-butoxyethoxy)ethyl)acetate), diethylene glycol monobutyl ether acetate, 3-methoxybutyl acetate, ethylene glycol monomethyl ether acetate, ethylene glycol monoethyl ether acetate, dipropylene glycol methyl ether acetate, propylene glycol diacetate, and 1,3-butylene glycol diacetate; and solvents of ethers such as dipropylene glycol methyl ether, tripropylene glycol methyl ether, propylene glycol n-propyl ether, dipropylene glycol n-propyl ether, propylene glycol n-butyl ether, dipropylene glycol n-butyl ether, tripylene glycol n-propyl ether, propylene glycol phenyl ether, dipropylene glycol dimethyl ether, 1,3-dioxolan, ethylene glycol monobutyl ether, diethylene glycol monoethyl ether, diethylene glycol monobutyl ether, and ethylene glycol monoethyl ether. It is preferable to use, among the above organic solvents, a symmetric glycol diether because it is less likely to cause a side reaction.

It is desirable that the solvent used in the reaction be added in such an amount that a solute weight concentration in a reaction solution, that is, a concentration of the reaction solution, is not lower than 5% by weight and not higher than 90% by weight. The solute weight concentration in the reaction solution is more preferably not lower than 10% by weight and not higher than 80% by weight. If the concentration of the reaction solution is lower than 5% by weight, it will be difficult to produce a polymerization reaction, and a reaction speed will decrease. As a result, an intended structural substance may not be prepared.

<(B) Spherical Organic Beads>

The (B) spherical organic beads of the present invention are a spherical polymer containing carbon, and include elliptical beads as well. The (B) spherical organic beads of the second aspect of the invention are identical to those described in (1. First Aspect of Invention of Present Application) above. The description above applies here as well. The (B) spherical organic beads are thus not described here.

<(C) Fine Particles Containing Elemental Phosphorus>

The (C) fine particles containing elemental phosphorus in accordance with the present invention are each a fine particle containing at least one elemental phosphorus in its structure.

The component (C) according to the present invention has an average particle diameter that can be measured by, for example, a method similar to that for the component (B).

The component (C) according to the present invention preferably has an average particle diameter of 1 μm to 10 μm for excellent flexibility and flame retardancy of the insulating film. An average particle diameter of smaller than 1 μm may not allow irregularities to be formed effectively at a surface of the insulating film, with the result of decreased tack-free property. An average particle diameter of larger than 10 μm may, for example, (i) decrease folding endurance and/or (ii) cause particles to be exposed through an opening caused during fine pattern formation, with the result of a resolution defect.

The component (C) according to the present invention is not particularly limited to any specific one. Examples of the component (C) include: fine particles of ammonium polyphosphate; those of melamine phosphate; and those of phosphinate. These can be used solely, or two or more types thereof can be used in combination.

The component (C) according to the present invention is preferably fine particles of phosphinate in particular, among the above types of fine particles containing elemental phosphorus, because particles of phosphinate can impart excellent flame retardancy to the insulating film and cause only a little bleedout from the insulating film. This arrangement makes it possible to prevent a contact fault and pollution during a process.

The phosphinate of the present invention is a compound represented by General Formula (8):

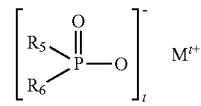

General Formula (8)

where, $R_5$ and $R_6$ each independently represent a linear or branched alkyl group or aryl group having 1 to 6 carbon atoms; M represents at least one metal selected from the group consisting of Mg, Ca, Al, Sb, Sn, Ge, Ti, Fe, Zr, Zn, Ce, Bi, Sr, Mn, Li, Na, and K; and t represents an integer of 1 to 4.

The phosphinate according to the present invention is not particularly limited to any specific one as long as it has the above structure. Examples of the phosphinate include: aluminum trisdiethylphosphinate; aluminum trismethylethylphosphinate; aluminum trisdiphenylphosphinate; zinc bisdiethylphosphinate; zinc bismethylethylphosphinate; zinc bisdiphenylphosphinate; titanyl bisdiethylphosphinate; titanyl bismethylethylphosphinate; and titanyl bisdiphenylphosphinate. These phosphinates can be used solely, or two or more types thereof can be used in combination. The (C) fine particles containing elemental phosphorus in accordance with the present invention preferably further contain elemental aluminum for higher flame retardancy. In particular, containing aluminum trisdiethylphosphinate or aluminum trismethylethylphosphinate, each containing elemental aluminum, is preferable for even higher flame retardancy.

The component (C) of the present invention is contained at an amount that is, with respect to 100 parts by weight of the component (A), preferably 20 to 80 parts by weight, or more preferably 25 to 75 parts by weight. This arrangement allows a cured film produced to be excellent in flame retardancy and electrical insulation reliability. Containing the component (C) at an amount smaller than 20 parts by weight may cause a decrease in flame retardancy. Containing the component (C) at an amount larger than 80 parts by weight may (i) cause a decrease in ease of coating with a resin composition solution, and consequently (ii) cause foaming of a coating film during coating and/or an appearance defect due to insufficient leveling.

<(D) Thermosetting Resin>

The (D) thermosetting resin of the present invention is a compound containing at least one thermosetting organic group in its molecule. The (D) thermosetting resin of the second aspect is identical to that described in (1. First Aspect of Invention of Present Application) above. The description above applies here as well. The (D) thermosetting resin is thus not described here.

<(E) Photopolymerization Initiator>

The (E) photopolymerization initiator according to the present invention is a compound that is activated by energy such as UV energy and that starts and accelerates a reaction of a radically polymerizable group. The (E) photopolymerization initiator of the second aspect is identical to that described in (1. First Aspect of Invention of Present Application) above. The description above applies here as well. The (E) photopolymerization initiator is thus not described here.

<Other Components>

The insulating film according to the present invention can further include, as needed, any of various additives such as a radically polymerizable compound, a filler, an adhesive auxiliary agent, a defoaming agent, a leveling agent, a coloring agent, and a polymerization inhibitor. The <Other Components> of the second aspect are also identical to those described in (1. First Aspect of Invention of Present Application) above. The description above applies here as well. The <Other Components> are thus not described here.

The insulating film according to the present invention, which includes the (C) fine particles containing elemental phosphorus, has excellent flame retardancy. The insulating film may, however, further include another flame retardant for greater flame retardancy. Such a flame retardant is, for example, a halogen-based compound, a phosphorus-based compound, a metal hydroxide, or a melamine-based compound. The above various additives can be used solely, or two or more types thereof can be used in combination.

<How Component (B) and Component (C) are Dispersed in Insulating Film>

The component (B) and component (C) of the present invention being dispersed in the insulating film refers to the state of, in a cross section of the insulating film which cross section is cut along the thickness direction of the insulating film, (i) the (B) spherical organic beads being each independently observed as a spherical or elliptical region and (ii) the (C) fine particles being each independently observed as an indefinitely shaped, circular or polygonal region. Preferably, (i) the (B) spherical organic beads are observed independently of one another, (ii) the (C) fine particles are observed independently of one another, and (iii) the (B) spherical organic beads and the (C) fine particles are observed independently of each other. Alternatively, as long as the advantageous effects of the present invention are not impaired, (i) the (B) spherical organic beads may be observed as being adjacent to one another, (ii) the (C) fine particles may be observed as being adjacent to one another, and (iii) the (B) spherical organic beads and the (C) fine particles may be observed as being adjacent to each other. The expression "as long as the advantageous effects of the present invention are not impaired" refers to the range within which (i) a total length of adjacent component (B) regions, (ii) a total length of adjacent component (C) regions, and (iii) a total length of adjacent component (B) and component (C) regions are each not larger than the thickness of the insulating film on an imaginary line drawn on a cross section of the insulating film which cross section is cut along the thickness direction of the insulating film, the imaginary line extending from an arbitrary point of a surface of the insulating film to a surface of a base material so as to be orthogonal to the surface of the base material.

With reference to FIG. 2, the description below deals with the dispersion of the component (B) and component (C) according to the present invention in the insulating film. An insulating film 1 is, as illustrated in FIG. 2, arranged to contain, present in a cross section of the insulating film 1 which cross section is cut along the thickness direction of the insulating film 1, (i) a continuous phase 2, (ii) a dispersion phase 3, which is made of the component (B) and which includes spherical or elliptical regions independent of one another, and (iii) a dispersion phase 4', which is made of the component (C) and which includes indefinitely shaped, circular or polygonal regions independent of one another. The phrase "cross section of the insulating film which cross section is cut along the thickness direction of the insulating film" refers to a surface that is cut, in the case where the insulating film is provided on a base material 5 such as a printed wiring board, along an axis direction extending in the direction of the base material from a surface of the insulating film.

The dispersion of the component (B) and component (C) according to the present invention in the insulating film can be determined by any method. An example method is a method of, as described below, (i) embedding, in a thermosetting resin, a printed wiring board including the insulating film, (ii) polishing, with use of an ion beam, a cross section of the insulating film which cross section is cut along the thickness direction of the insulating film, and (iii) observing the cross section of the insulating film under a scanning electron microscope.

(Cross Section Exposure of Insulating Film)

This example method, in the case where the insulating film was provided on a base material such as a printed wiring board, (i) cut out a 5 mm×3 mm region with use of a box cutter, (ii) formed a protective film layer and a cover glass layer with use of an epoxy-based molding resin and a cover glass respectively on each surface of the above cut-out laminate, that is, a surface on the insulating film side and a surface on the base material side, and (iii) performed, with use of an ion beam, a process of cross section polisher on a cross section of the insulating film which cross section was cut along the thickness direction of the insulating film.

(Process of Cross Section Polisher)

Apparatus used: equivalent of SM-09020CP manufactured by JEOL Ltd.

Processing condition: acceleration voltage of 6 kV (Observation of Cross Section of Insulating Film)

This example method observed, under a scanning electron microscope, the above-formed cross section of the insulating film which cross section was cut along the thickness direction of the insulating film.

(Observation Under Scanning Electron Microscope)

Apparatus used: equivalent of S-3000N manufactured by Hitachi High-Technologies Corporation Observation condition: acceleration voltage of 15 kV Detector: detection of reflected electrons (composition mode)

Magnification: 1000

The detection of reflected electrons (composition mode), which detection was used in this method, causes contrast to strongly reflect the difference between respective average atomic numbers in observation regions, and thus allows (i) a region in which a heavy element is present to be observed as bright (white) and (ii) a region in which a light element is present to be observed as dark (black). Consequently, the detection of reflected electrons allows (i) dark (black), circular regions to be observed in correspondence with the (B) spherical organic beads, which are made of organic matter of comparatively light elements such as carbon, hydrogen, oxygen, and nitrogen and (ii) dim (gray), circular or polygonal regions to be observed in correspondence with the (C) fine particles, which are indefinite in shape and which contain elemental phosphorus, which is a comparatively heavy element.

The component (B) having a urethane bond in its molecule can be determined by (i) analyzing, by an infrared absorption microspectrometry (µIR) similar to that used for the component (A), component (B) regions in a cross section of the insulating film which cross section is cut along the thickness direction of the insulating film and (ii) determining whether a spectrum derived from stretching vibration between C=O in a urethane bond is present within or near a range of 1715 to 1730 $cm^{-1}$.

Further, information on the element contained in the component (C) can be obtained by analyzing, with use of a scanning electron microscopline X-ray microanalyzer (SEM-EPMA), component (C) regions in a cross section of the insulating film which cross section is cut along the thickness direction of the insulating film. This makes it possible to determine that the component (C) contains elemental phosphorus.

(Analysis with Use of Scanning Electron Microscopline X-Ray Microanalyzer)

Apparatus used: equivalent of EMAX-7000 manufactured by Horiba, Ltd.

Analysis condition: acceleration voltage of 15 kV and integration time period of 900 seconds With reference to FIG. 2, the description below deals with the length of the component (B) on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material. The length of the component (B) on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, corresponds, as illustrated in FIG. 2, to lengths d1 and d2 of respective component (B) regions observed on a line 6 drawn on a cross section of the insulating film 1 which cross section is cut along the thickness direction of the insulating film 1, the line 6 extending from an arbitrary point of a surface of the insulating film 1 to a base material surface 7 so as to be orthogonal to the base material surface 7 in a scanning electron microscopic image.

The component (B) according to the present invention is preferably arranged in length such that at least one component (B) region has a length of 3 µm to 15 µm for excellent flexibility and chemical resistance of the insulating film. The component (B) having a length of smaller than 3 µm may not allow irregularities to be formed effectively at a surface of the insulating film, with the result of decreased tack-free property. The component (B) having a length of larger than 15 µm may cause particles to be exposed through an opening caused during fine pattern formation, with the result of a resolution defect. The length of the component (B) may simply be determined by performing, in order to prevent a measurement deviation and abnormal detection, three measurements at positions different from one another, each of which measurements (i) sets an arbitrary point, (ii) measures the length, starting from the arbitrary point, at 10 points located at 5-µm intervals, (iii) omits the maximum and minimum values from the measured values, and (iv) averaging the remaining values to find a measurement value.

The length of the component (C) on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, can also be measured by a method similar to that used to measure the length of the component (B).

The component (C) according to the present invention is preferably arranged in length such that at least one component (C) region has a length of 1 µm to 10 µm for excellent flexibility and chemical resistance of the insulating film. The component (C) having a length of smaller than 1 µm may not allow irregularities to be formed effectively at a surface of the insulating film, with the result of decreased tack-free property. The component (C) having a length of larger than 10 µm may, for example, (i) decrease folding endurance and/or (ii) cause particles to be exposed through an opening caused during fine pattern formation, with the result of a resolution defect. The length of the component (C) may simply be determined by performing, in order to prevent a measurement deviation and abnormal detection, three measurements at positions different from one another, each of which measurements (i) sets an arbitrary point, (ii) measures the length, starting from the arbitrary point, at 10 points located at 5-µm intervals, (iii) omits the maximum and minimum values from the measured values, and (iv) averaging the remaining values to find a measurement value.

<Proportion of Total Length of Component (B) Regions with Respect to Length of Line Segment Corresponding to Insulating Film on Imaginary Line Drawn in Cross Section of Insulating Film which Cross Section is Cut Along Thickness Direction of Insulating Film, Imaginary Line Extending from Arbitrary Point of Surface of Insulating Film to Surface of Base Material so as to be Orthogonal to Surface of Base Material>

With reference to FIG. 2, the description below deals with the proportion of a total length of component (B) regions with respect to the length of the line segment corresponding to the insulating film of the present invention on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material. A total length of component (B) regions on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, corresponds, as illustrated in FIG. 2, to the total of the lengths d1 and d2 of respective component (B) regions observed on a line 6 extending from an arbitrary point of a surface of the insulating film to a base material surface 7 so as to be orthogonal to the base material surface 7 in a cross section of the insulating film 1 in a scanning electron microscopic image which cross section is cut along the thickness direction of the insulating film 1.

The proportion (%) of a total length of component (B) regions with respect to the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, can be calculated by the following equation:

(Total length of component (B) regions/length of the insulating film region)×100.

The proportion, measured by the above method, of a total length of component (B) regions with respect to the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, needs to fall within a range from 20% to 80%, or preferably falls within a range from 20% to 70%. The proportion within the above range allows irregularities to be effectively formed at a surface of the insulating film, thus allowing the insulating film to have excellent tack-free property. The above arrangement also allows the component (B) to produce a filling effect, thus decreasing warpage of the insulating film. The above arrangement further improves, for example, a stress relaxing effect and fracture toughness of the insulating film, thus improving flexibility of being able to resist repeated foldings. The component (B) regions covering a length of smaller than 20% will cause a decrease in tack-free property and/or flexibility of being able to resist repeated foldings. The component (B) regions covering a length of larger than 80% will (i) cause a decrease in flame retardancy and/or ease of coating with a resin composition solution for forming the insulating film, and consequently (ii) cause foaming of a coating film during coating and/or an appearance defect due to insufficient leveling.

The proportion of a total length of component (B) regions with respect to the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, may, in the case where in order to prevent a measurement deviation and abnormal detection, three measurements are performed at positions different from one another, each of which measurements (i) sets an arbitrary point, (ii) measures the length, starting from the arbitrary point, at 10 points located at 5-μm intervals, (iii) omits the maximum and minimum values from the measured values, and (iv) averaging the remaining values to find a measurement value, fall within the range from 20% to 80% in at least one or all of the three measurements.

In order that the proportion of a total length of component (B) regions with respect to the length of the line segment corresponding to the insulating film on an imaginary line drawn on a cross section of the insulating film which cross section is cut along the thickness direction of the insulating film, the imaginary line extending from an arbitrary point of a surface of the insulating film to a surface of the base material so as to be orthogonal to the surface of the base material, falls within the range from 20% to 80%, a preferable method to use is, for example, a method of, in the method for determining the dispersion of the component (B) in the insulating film, (i) drawing a single line in a cross section of the insulating film in a scanning electron microscopic image which cross section is cut along the thickness direction of the insulating film, the line extending from an arbitrary point of a surface of the insulating film to a surface of the base material so as to be orthogonal to the surface of the base material, and causing at least one component (B) region on the line to have a length of 3 μm to 15 μm or (ii) containing the component (B) in an amount that is 30 to 100 parts by weight with respect to 100 parts by weight of the (A) compound having a urethane bond in its molecule.

(II) Method for Forming Insulating Film

The insulating film of the present invention can be produced by (i) mixing the components (A) to (C) and, as needed, the components (D) and (E) and other components to obtain a resin composition, (ii) applying the resin composition onto a base material, (iii) drying the resin composition, (iv) forming a fine opening as needed by exposure and development, and (v) performing a heat treatment on the resulting product. The method of the second aspect for forming an insulating film is identical to that described in (1. First Aspect of Invention of Present Application) above. The description above applies here as well. The method of the second aspect for forming an insulating film is thus not described here.

The insulating film of the present invention is excellent in flexibility of being able to resist repeated foldings, flame retardancy, and electrical insulation reliability, and has reduced warpage. The insulating film is thus particularly suitable as an insulating film for a flexible substrate. The insulating film is further used for any of various wiring line coating protective agents, heat-resistant adhesives, and electric wire/cable insulating coatings.

EXAMPLES

The following more specifically describes Examples of the present invention. However, the present invention is not limited to Examples as below.

a. Example Regarding First Aspect of Invention of Present Application

Synthesis Example 1a

<(A) Binder Polymer 1>

Into a reaction vessel equipped with a stirrer, a thermometer, and a nitrogen-inlet tube, 30.00 g of methyl triglyme (1,2-bis(2-methoxyethoxy)ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. To a resultant solution was added, over 1 hour, a solution (a) in which (i) 50.0 g (0.025 mol) of polycarbonate diol (manufactured by Asahi Kasei Co., Ltd., product name: PCDL T5652, a weight-average molecular weight of 2000) and (ii) 6.51 g (0.050 mol) of 2-hydroxyethyl methacrylate were dissolved into methyl triglyme (30.0 g). A mixture solution thus obtained was stirred under heating at 80° C. for 5 hours for reaction. As a result of the reaction, a resin solution containing, in its molecule, a urethane bond and a methacryloyl group was obtained. The resin solution thus obtained had a solid content concentration of 53% and a weight-average molecular weight of 5,200. Measurements of the solid content concentration and the weight-average molecular weight were carried out by the methods as below.

<Solid Content Concentration>

Measurement of the solid content concentration was carried out in accordance with JIS K 5601-1-2. As a drying condition, a condition of 170° C. for 1 hour was selected.

<Weight-Average Molecular Weight>

Apparatus used: equivalent of HLC-8220GPC manufactured by TOSOH Corporation

Column: TSK gel Super AWM-H manufactured by TOSOH Corporation (6.0 mm I.D.×15 cm) (2 columns)
Guard column: TSK guard column Super AW-H manufactured by TOSOH Corporation
Carrier: 30 mM LiBr+20 mM H3PO4 in DMF
Flow speed: 0.6 mL/min
Column temperature: 40° C.
Detection conditions: RI:polarity (+), response (0.5 sec)
Sample concentration: approximately 5 mg/mL Synthesis Example 2a <(A) Binder Polymer 2>

Into a reaction vessel equipped with a stirrer, a thermometer, and a nitrogen-inlet tube, 30.00 g of methyl triglyme (1,2-bis(2-methoxyethoxy)ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. To a resultant solution was added, over 1 hour, a solution (a) in which (i) 50.0 g (0.025 mol) of polycarbonate diol (manufactured by Asahi Kasei Co., Ltd., product name: PCDL T5652, a weight-average molecular weight of 2000) and (ii) 3.70 g (0.025 mol) of 2,2-bis(hydroxymethyl)butanoic acid were dissolved into methyl triglyme (30.0 g). A mixture solution thus obtained was stirred under heating at 80° C. for 5 hours for reaction. As a result of the reaction, a resin solution containing, in its molecule, a urethane bond and a carboxyl group was obtained. A resin solution thus obtained had a solid content concentration of 52%, a weight-average molecular weight of 5,600, and an acid number of 22 mg KOH/g based on a solid content. Measurements of the solid content concentration and the weight-average molecular weight were carried out by the same methods as in Synthesis Example 1a, and measurement of the acid number was carried out by the method as below.

<Acid Number>

Measurement of the acid number was carried out in accordance with JIS K 5601-2-1.

Synthesis Example 3a

<(A) Binder Polymer 3>

Into a reaction vessel equipped with a stirrer, a thermometer, a dropping funnel, and a nitrogen-inlet tube, 100.00 g of methyl triglyme (1,2-bis(2-methoxyethoxy)ethane) was poured as a solvent for polymerization and was then heated to 80° C. while being stirred under nitrogen stream. To the solvent thus heated, a mixed solution prepared by mixing, in advance at room temperature, 12.0 g (0.14 mol) of methacrylic acid, 28.0 g (0.16 mol) of benzyl methacrylate, 60.0 g (0.42 mol) of butyl methacrylate, and 0.5 g of azobisisobtyronitrile that serves as a radical polymerization initiator, was added dropwise over 3 hours with the dropping funnel while being heated at 80° C. After completion of the dropwise addition, the reactant solution thus obtained was heated to 90° C. while being stirred, and the reactant solution was reacted by being further stirred for 2 hours while being maintained at 90° C. As a result of the reaction, an acryl-based resin solution containing a carboxyl group in its molecule was obtained. A resin solution thus obtained had a solid content concentration of 50%, a weight-average molecular weight of 48,000, and an acid number of 78 mg KOH/g based on a solid content. Measurements of the solid content concentration and the weight-average molecular weight were carried out by the same methods as in Synthesis Example 1a, and measurement of the acid number was carried out by the same method as in Synthesis Example 2a.

Examples 1a to 7a

<Preparation of Resin Composition>

Each of the components (A) obtained in Synthesis Example 1a, 2a, and 3a, (B) spherical organic beads, (C) fine particles containing at least one element selected from the group consisting of phosphorus, aluminum, and magnesium, a (D) thermosetting resin, a (E) photopolymerization initiator, other components, and an organic solvent were mixed to prepare a resin composition. Respective amounts of constituent raw materials in terms of a resin solid content, and types of the constituent raw materials are shown in Table 1. In Table 1, the amount of 1,2-bis(2-methoxyethoxy)ethane as a solvent indicates a total amount of solvent including a solvent contained in the resin solution obtained by the above synthesis. First, the resin composition was blended in a stirring device equipped with a general stirring blade. Thereafter, the resin composition passed twice through a triple roll mill so as to be a uniform solution. As a result of measurement of respective particle diameters of components contained in the resin composition by a grindometer, all the components contained in the resin composition are not larger than 15 μm in particle diameter. The resin composition thus obtained was set in a defoaming device so that the resin composition was completely defoamed. A resultant resin composition was then evaluated as follows.

TABLE 1

Unit: Part by Weight

| Component | | Ex. 1a | Ex. 2a | Ex. 3a | Ex. 4a | Ex. 5a | Ex. 6a | Ex. 7a |
|---|---|---|---|---|---|---|---|---|
| (A) | Binder Polymer 1 | 60.0 | — | 60.0 | 60.0 | 18.0 | 18.0 | 18.0 |
| | Binder Polymer 2 | — | 60.0 | — | — | — | — | — |
| | Binder Polymer 3 | — | — | — | — | 42.0 | 42.0 | 42.0 |
| (B) | Daimic Beads UCN-8070CM Clear <1> | 40.0 | 45.0 | 25.0 | 50.0 | 40.0 | 40.0 | 40.0 |
| (C) | Exolit OP-935 <2> | 30.0 | 30.0 | 30.0 | 30.0 | 30.0 | — | — |
| | HIGILITE H-42M <3> | — | — | — | — | — | 30.0 | — |
| | ECOMAG Z-10 <4> | — | — | — | — | — | — | 30.0 |
| (D) | TEPIC-SP <5> | 10.0 | 10.0 | 10.0 | 10.0 | 10.0 | 10.0 | 10.0 |
| (E) | IRGACURE 369 <6> | 3.0 | 3.0 | 3.0 | 3.0 | 3.0 | 3.0 | 3.0 |

TABLE 1-continued

| | | | | | | | Unit: Part by Weight | |
|---|---|---|---|---|---|---|---|---|
| Component | | Ex. 1a | Ex. 2a | Ex. 3a | Ex. 4a | Ex. 5a | Ex. 6a | Ex. 7a |
| Others | FANCRYL FA-321M <7> | 15.0 | 15.0 | 15.0 | 15.0 | 15.0 | 15.0 | 15.0 |
| | FLOWLEN AC-2000 <8> | 1.0 | 1.0 | 1.0 | 1.0 | 1.0 | 1.0 | 1.0 |
| Solvent | 1,2-bis(2-methoxyethoxy) ethane | 100.0 | 100.0 | 100.0 | 100.0 | 100.0 | 100.0 | 100.0 |

<1> Manufactured by Dainichiseika Colour & Chemicals Mfg. Co., Ltd., product name of spherical organic beads (crosslinked spherical organic beads containing a urethane bond in its molecule), average particle diameter of 7 μm
<2> Manufactured by Clariant Japan K.K., product name of fine particles (diethylphosphinate aluminum salt) containing elemental phosphorus and elemental aluminum, average particle diameter of 2.5 μm
<3> Manufactured by Showa Denko K.K., product name of fine particles (aluminum hydroxide) containing elemental aluminum, average particle diameter of 1.0 μm
<4> Manufactured by Tateho Chemical Industries Co., Ltd., product name of fine particles (magnesium hydroxide) containing elemental magnesium, average particle diameter of 1.0 μm
<5> Manufactured by Nissan Chemical Industries, Ltd., product name of a thermosetting resin (triglycidyl isocyanurate)
<6> Manufactured by BASF Japan Ltd., product name of a photopolymerization initiator
<7> Manufactured by Hitachi Chemical Co., Ltd., product name of EO-modified bisphenol A dimethacrylate
<8> Manufactured by Kyoeisha Chemical Co., Ltd., product name of a butadiene defoaming agent <Formation of Cured Film on Polyimide Film>

With the use of a Baker's applicator, the resin composition was flow-cast and applied to a 100 mm×100 mm area of a polyimide film (manufactured by Kaneka Corporation, product name: 25NPI) having a thickness of 25 μm so that a finally dried film had a thickness of 20 μm. A resultant film was dried at 80° C. for 20 minutes and then exposed to ultraviolet rays having an integrated exposure amount of 300 mJ/cm². Subsequently, the film was developed by spraying a 1.0 weight % sodium carbonate aqueous solution heated at 30° C., at a spraying pressure of 1.0 kgf/mm² for 90 seconds. After the development, the film was rinsed with purified water sufficiently, and then cured by heating in an oven at 150° C. for 30 minutes. Thus, a laminate of the polyimide film and a cured film provided on the polyimide film was prepared.

<Evaluation of Cured Film>

The cured film thus prepared was evaluated in terms of the following items. Evaluation results are shown in Table 2.

(i) How Component (B) and Component (C) are Dispersed in Insulating Film

Each of the Examples 1a to 7a (i) cut out, with use of a box cutter, a 5 mm×3 mm region from a laminate having a cured film that had been obtained by a method similar to the method described in <Formation of Cured Film on Polyimide Film> above, (ii) formed a protective film layer and a cover glass layer with use of an epoxy-based molding resin and a cover glass respectively on each surface of the above cut-out laminate, that is, a surface on the insulating film side and a surface on the base material side, and (iii) performed, with use of an ion beam, a process of cross section polisher on a cross section of the insulating film which cross section was cut along the thickness direction of the insulating film.

Apparatus used: equivalent of SM-09020CP manufactured by JEOL Ltd.

Processing condition: acceleration voltage of 6 kV

The above-formed cross section of the insulating film which cross section was cut along the thickness direction of the insulating film was observed under a scanning electron microscope.

Apparatus used: equivalent of S-3000N manufactured by Hitachi High-Technologies Corporation Observation condition: acceleration voltage of 15 kV Detector: detection of reflected electrons (composition mode)

Magnification: 1000

(I) "G (Good)" indicates that (i) the component (B) was observed as spherical or elliptical regions that are independent from each other, and (ii) the component (C) was observed as indefinitely-shaped, circular or polygonal regions that are independent from each other.

(II) "P (Poor)" indicates that (iii) the component (B) was not observed as spherical or elliptical regions that are independent from each other, and (ii) the component (C) was not observed as indefinitely-shaped, circular or polygonal regions that are independent from each other.

(ii) Proportion of Surface Area Occupied by Component (B) Present in any 125 μm×15 μm Region of Cross Section of Insulating Film which Cross Section was Cut Along Thickness Direction of Insulating Film Each of Examples 1a to 7a actually measured respective maximum lengths of all component (B) regions that had been observed in any 125 μm×15 μm region of the insulating film portion in a scanning electron microscopic image by an observation method similar to the method described in Section (i) as above. Then, a sum total of the respective surface areas of all the component (B) regions was calculated from the actually measured lengths. Consequently, a proportion of a surface area occupied by the component (B) in the 125 μm×15 μm region was measured.

(iii) Particle Diameter of Component (B) Present in any 125 μm×15 μm Region of Cross Section of Insulating Film which Cross Section was Cut Along Thickness Direction of Insulating Film Assuming that a particle diameter of each of the component (B) regions is the maximum length of each of the component (B) regions which length had been measured by the observation method similar to that described in Section (i) as above, measurements were carried out as to (a) respective particle diameters of the largest and smallest particles among the particles of the component (B) present in the 125 μm×15 μm region of the cross section of the insulating film which cross section had been cut along the thickness direction of the insulating film and as to (b) a proportion of the particles having a particle diameter of 3 μm to 15 μm in all of the particles of the component (B).

(iv) Particle Diameter of Component (C) Present in any 125 μm×15 μm Region of Cross Section of Insulating Film which Cross Section was Cut Along Thickness Direction of Insulating Film Assuming that a particle diameter of each of the component (C) regions is the maximum length of each of the component (C) regions which length had been measured by the observation method similar to that described in Section (i) as above, measurements were carried out as to respective particle diameters of the largest and smallest particles among the particles of the component (C) present in the 125 μm×15 μm region of the cross section of the insulating film which cross section had been cut along the thickness direction of the insulating film.

(v) Tack-Free Property

With the use of a Baker's applicator, the resin composition was flow-cast and applied to a 100 mm×100 mm area of a polyimide film (manufactured by Kaneka Corporation, product name: 25NPI) having a thickness of 25 μM so that a finally dried film had a thickness of 20 μm. A resultant film was dried at 80° C. for 20 minutes to prepare a dried coating film from which the solvent had been dried off. The evaluation of tack-free property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid strips for 3 seconds. Thereafter, the load was removed, and the overlaid strips were then peeled off each other. The coating film sides of the strips thus peeled off were observed. The evaluation was based on definition as follows:

(I) "G (Good)" indicates that the coating films were separated from each other with no tacks left on the coating films;
(II) "U (Unsatisfactory)" indicates that the coating films were slightly stuck to each other with a tack left on the coating films; and
(III) "P (Poor)" indicates that the coating films were completely stuck to each other to such a degree that the coating films could not be peeled off each other.

(vi) Folding Endurance

In the same manner as in <Formation of Cured Film on Polyimide Film> above, an insulating-film-laminated film having a thickness of 20 μm was prepared by applying the resin composition on a surface of a polyimide film (APICAL 25NPI manufactured by Kaneka Corporation) having a thickness of 25 μm. The evaluation of folding endurance on the insulating-film-laminated film was carried out in the following method. The insulating-film-laminated film was cut out into strips each having a size of 50 mm×10 mm. Each of the strips was folded in the middle (at a point 25 mm from its edge) to an angle of 180° in such a state that the insulating film faces outside. Then, a load of 5 kg was placed on a folded part of the strip for 3 seconds. After that, the load was removed, and an apex of the folded part was observed microscopically. After the microscopic observation, the strip was unfolded, and a load of 5 kg was then placed on the unfolded strip for 3 seconds. After that, the load was removed, and the strip of the cured-film-laminated film was completely unfolded. The above action was repeatedly carried out. The evaluation of folding endurance on the insulating-film-laminated film was carried out in how many times folding had been carried out before cracking occurred on the folded part. The evaluation was based on definition as follows:

(I) "G (Good)" indicates that no cracking occurred on an insulating film at the completion of a fifth round of folding;
(II) "U (Unsatisfactory)" indicates that no cracking occurred on an insulating film at the completion of a third round of folding; and
(III) "P (Poor)" indicates that cracking occurred on an insulating film at the completion of a first round of folding.

(vii) Electrical Insulation Reliability

On a flexible copper-clad laminate (the thickness of an electrolytic copper foil is 12 μm, a polyimide film is APICAL 25NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, rinsed with purified water, and subjected to a surface treatment of the copper foil. After that, in the same manner as in <Formation of Cured Film on Polyimide Film> above, an insulating film having a thickness of 20 μm was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance value, an occurrence of migration, and the like. The evaluation was based on definition as follows:

(I) "G (Good)" indicates one in which 1000 hours after the start of the test, a resistance value was not less than $10^8$, and no occurrence of migration, formation of dendrites, or the like was observed; and
(II) "P (Poor)" indicates one in which 1000 hours after the start of the test, an occurrence of migration, formation of dendrites, or the like was observed.

(viii) Solder Heat Resistance

In the same manner as in <Formation of Cured Film on Polyimide Film> above, an insulating-film-laminated film having a thickness of 20 μm was prepared by applying the photosensitive resin composition on a surface of a polyimide film (APICAL 75NPI manufactured by Kaneka Corporation) having a thickness of 75 μm. A resultant insulating-film-laminated film was floated on a solder bath that was completely melted at 260° C., in such a state that an insulating film side of the insulating-film-laminated film was in contact with the solder bath. The evaluation was based on definition as follows:

Ten seconds later, the insulating-film-laminated film was pulled up. This operation was repeated 3 times, and the state of the surface of the film was observed.

(I) "G (Good)" indicates that there was nothing wrong with the insulating film; and
(II) "P (Poor)" indicates that swelling, detachment, and/or the like problem occurred on the insulating film.

(ix) Warpage

In the same manner as in <Formation of Cured Film on Polyimide Film> above, an insulating-film-laminated film having a thickness of 20 μm was prepared by applying the resin composition on a surface of a polyimide film (APICAL 25NPI manufactured by Kaneka Corporation) having a thickness of 25 μm.

The insulating-film-laminated film was cut into a film having an area of 50 mm×50 mm, and the film was placed on a flat and smooth table with its insulating film side facing upward. Then, how much an end portion of the film was warped was measured. FIG. 3 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm. Note that the film was rated as "P (poor)" when it curled into a tubular form.

(x) Flame Retardancy

In accordance with UL94VTM standard for test for flammability of plastic materials, a flammability test was carried out as follows. In the same manner as in <Formation of Cured Film on Polyimide Film> above, an insulating-film-laminated film having a thickness of 25 μm was prepared by applying the resin composition on both surfaces of a polyimide film (product name: APICAL 25NPI manufacture by Kaneka Corporation) having a thickness of 25 μm. The sample thus prepared was cut into specimens each having a dimension of 50 mm in width, by 200 mm in length, and by 75

μm in thickness (including the thickness of the polyimide film). The specimens were each marked with a line across the specimen width at a 125 mm position from one end of the specimen. The specimen was then rolled into a tubular form having a diameter of approximately 13 mm, and overlapping ends of the specimen were secured, without clearance, within the 75 mm portion above the 125 mm line by means of a PI tape. In this manner, 20 tubes for use in the flammability test were prepared. Out of 20 tubes, 10 tubes were processed (1) at 23° C. and a relative humidity of 50% for 48 hours, whereas the remaining 10 tubes were processed (2) at 70° C. for 168 hours and then cooled for more than 4 hours in a desiccator containing anhydrous calcium chloride. These specimens were each clamped at the upper end portion of the specimen so as to be fixed upright, and flame of a burner was applied to a free lower end portion of the specimen for 3 seconds so that the free lower end portion was ignited. After a lapse of 3 seconds, the flame of the burner was removed from the specimen, and the length of time (in seconds) for which the specimen continued to flame and/or burn after the burner had been removed from the specimen was measured. The evaluation was based on definition as follows:

(I) "G (Good)" indicates that the specimen, out of two sets of the specimens processed respectively under the conditions (1) and (2), ceased to flame and/or burn and automatically became extinct within an average of 10 seconds (average time for each set of 10 tubes) at maximum after the removal of the burner from the specimen, and each of the specimens ceased to burn before flaming reaches the 125 mm marked line.

(II) "P (Poor)" indicates that even one specimen did not extinct within 10 seconds after the removal of the burner, or even one specimen burned with flame going up to or beyond the marked line.

TABLE 2

| Evaluation Item | Ex. 1a | Ex. 2a | Ex. 3a | Ex. 4a | Ex. 5a | Ex. 6a | Ex. 7a |
|---|---|---|---|---|---|---|---|
| How Components (B) and (C) are dispersed | G | G | G | G | G | G | G |
| Proportion (%) of Surface Area Occupied by Component (B) | 36.6 | 40.5 | 22.9 | 47.2 | 35.8 | 36.5 | 34.2 |
| Particle Diameter (μm) of Particles of Component (B) | | | | | | | |
| Largest Particle | 10.6 | 14.6 | 12.3 | 12.8 | 11.2 | 12.3 | 13.4 |
| Smallest Particle | 3.2 | 2.7 | 4.5 | 3.2 | 3.6 | 3.8 | 3.2 |
| Proportion (%) of Particles having diameters of 3 μm to 15 μm in the Component (B) | 100 | 95 | 100 | 100 | 100 | 100 | 100 |
| Particle Diameter (μm) of Particles of Component (C) | | | | | | | |
| Largest Particle | 5.6 | 8.9 | 7.8 | 7.2 | 7.2 | 2.4 | 2.8 |
| Smallest Particle | 0.5 | 0.3 | 0.5 | 0.4 | 0.6 | 0.2 | 0.4 |
| Tack-free Property | G | G | U | G | G | G | G |
| Folding Endurance | G | G | G | G | G | G | P |
| Electrical Insulation Reliability | G | G | G | G | G | G | G |
| Solder Heat Resistance | G | G | G | G | G | G | G |
| Warpage (mm) | 2.0 | 1.0 | 1.0 | 1.0 | 1.5 | 2.5 | 2.5 |
| Flame Retardancy | G | G | G | G | G | G | G |

Comparative Example 1a

A resin composition was prepared as in Example 1a, but 20.0 parts by weight of the (B) spherical organic beads was contained therein. Evaluation of the resin composition thus prepared was carried out by the same method as in Example 1a. Evaluation results are shown in Table 3.

Comparative Example 2a

Into a reaction vessel equipped with a stirrer, a thermometer, a nitrogen-inlet tube, a Dean-Stark receiver, and a condenser tube, 58.8 g (0.20 mol) of 2,3,3',4'-biphenyltetracarboxylic acid dianhydride, 30 g (0.40 mol) of 3-aminopropanol, and 200 ml of dimethylacetamide were poured, and a mixture solution thus obtained was stirred under a nitrogen atmosphere at 100° C. for 1 hour. Subsequently, 50 ml of toluene was added to the resultant solution, and the resultant solution was then heated at 180° C. for 4 hours. Water generated by imidization was removed by azeotropic distillation with toluene. A reactant solution thus obtained was poured into 2 L of water, and a precipitate thus formed was separated, rinsed with water, and then dried under reduced pressure to thereby obtain 43.16 g of powder of difunctional hydroxyl-terminated imide oligomer. Next, into a reaction vessel equipped with a stirrer, a thermometer, and a nitrogen-inlet tube, 29.94 g (0.015 mol) of polycarbonate diol (manufactured by Kuraray Co., Ltd., product name: Kuraray Polyol C-2015, a weight-average molecular weight of 2000), 1.01 g (7.50 mmol) of 2,2-bis(hydroxymethyl)propionic acid, 8.53 g (34.09 mol) of 4,4'-diphenylmethane diisocyanate, and 13.7 g of isophorone were poured, and a mixture solution thus obtained was stirred under a nitrogen atmosphere at 80° C. for 1.5 hours. Subsequently, to a resultant solution thus obtained, 6.13 g (15.00 mmol) of the difunctional hydroxyl-terminated imide oligomerimide oligomer prepared as above and 31.9 g of isophorone were added, and a mixture solution was stirred at 80° C. for 1.5 hours. A urethane resin solution thus obtained had a solid content concentration of 50% by weight and a number-average molecular weight of 26,000. The urethane resin solution thus obtained was mixed with 10 parts by mass of epoxy resin (manufactured by Daicel Chemical Industries, Ltd., product name: EPOLEAD PB3600, epoxy equivalent weight of 194), 20 parts by mass of blocked isocyanate (manufactured by DIC Corporation, product name: BURNOCK D-550), and 0.8 parts by mass of amine-based curing catalyst (manufactured by Shikoku Chemical Corporation, product name: Curezole 2E4MZ), relative to 100 parts by mass of urethane resin, and a resultant mixture was evenly stirred and blended. To the resultant mixture thus obtained, 10 parts by mass of finely powdered silica (manufactured by Nippon AEROSIL Co., Ltd., product name: Aerosil 130, specific surface area (BET method) of 130 m²/g) was further added, and the mixture was stirred and kneaded to thereby obtain a uniformly blended resin composition. Properties evaluation of the resin composition thus obtained was carried out by the same method as in Example 1a. Evaluation results are shown in Table 3.

Comparative Example 3a

A reaction vessel equipped with a stirring device, a thermometer, and a condenser was charged with 70.7 g of polycarbonate diol (manufactured by Kuraray Co., Ltd., product name: Kuraray Polyol C-1065N, a weight-average molecular weight of 991), 13.5 g of 2,2-dimethylolbutanic acid, and 128.9 g of diethylene glycol ethyl ether acetate, and a mixture solution thus obtained was heated to 90° C. to thereby dissolve all these raw materials. The temperature of a reaction solution thus obtained was lowered to 70° C., and 42.4 g of methylene bis(4-cyclohexylisocanate (manufactured by Sumika Bayer Urethane Co., Ltd., product name: Desmodur-W) was added dropwise to the reaction solution over 30 minutes with a dropping funnel. After completion of the dropwise addition, reaction was carried out at 80° C. for 1 hour, at 90° C. for 1 hour, and at 100° C. for 2 hours. After substantial disappearance of isocanate from the solution was confirmed, 1.46 g of isobutanol (manufactured by Wako Pure Chemical Industries, Ltd.) was added dropwise to the solution, and reaction was then carried out at 105° C. for 1.5 hours. A urethane resin solution thus obtained had a solid content concentration of 50%, a number-average molecular weight of 6,800, and an acid number of 40 mg KOH/g based on a solid content. The urethane resin solution thus obtained was mixed with 37.5% by mass of epoxy resin (manufactured by Japan Epoxy Resins Co., Ltd., product name: jER828EL), 4% by mass of melamine as a curing accelerator, and 20% by mass of organic fine particles having a core-shell multilayer structure (Ganz Chemical Co., Ltd., product name: STAPHYLOID AC-3816, average particle diameter of 0.5 µm), relative to 100% by mass of urethane resin, and a mixture solution thus obtained was stirred and kneaded to thereby obtain a uniformly blended resin composition. Properties evaluation of the resin composition thus obtained was carried out by the same method as in Example 1a. Evaluation results are shown in Table 3.

Comparative Example 4a

Seventy parts by mass (solid content) of a copolymer (weight-average molecular weight of 70,000, acid number of 117 mg/g) prepared by copolymerization of methacrylic acid, methyl methacrylate, and methyl acrylate in proportion of 20:45:35 by mass, 30 parts by mass (solid content) of a urethane-bond-having monomer (manufactured by Shin-Nakamura Chemical Industry Co., Ltd., product name: UA-11), 5 parts by mass of a photopolymerization initiator (manufactured by BASF Japan Ltd., product name: IRGACURE 651), 13 parts by mass of diethylphosphinate aluminum salt (manufactured by Clariant Japan K.K., product name: Exolit OP-930), 10 parts by mass of a thermosetting agent (manufactured by Hitachi Chemical Co., Ltd., 2,2-bis[4-(4-N-maleimidephenoxy)phenyl]propane), 2 parts by mass of a thermal polymerization initiator (manufactured by NOF Corporation, product name: PERHEXYN 25B), 20 parts by mass of methylethyl ketone were mixed with each other, and then stirred and kneaded to thereby obtain a uniformly blended resin composition. Properties evaluation of the resin composition thus obtained was carried out by the same method as in Example 1a. Evaluation results are shown in Table 3.

TABLE 3

| Evaluation Item | Com. Ex. 1a | Com. Ex. 2a | Com. Ex. 3a | Com. Ex. 4a |
|---|---|---|---|---|
| How Components (B) and (C) are dispersed | G | P | P | P |
| Proportion (%) of Surface Area Occupied by Component (B) | 18.5 | — | 17.9 | — |
| Particle Diameter (µm) of Particles of Component (B) | | | | |
| Largest Particle | 10.8 | — | 0.8 | — |
| Smallest Particle | 2.4 | — | 0.2 | — |
| Proportion (%) of Particles having diameters of 3 µm to 15 µm in the Component (B) | 97 | — | 0 | — |
| Particle Diameter (µm) of Particles of Component (C) | | | | |
| Largest Particle | 6.3 | — | — | 20.5 |
| Smallest Particle | 0.5 | — | — | 0.6 |
| Tack-free Property | P | P | P | P |
| Folding Endurance | U | G | P | P |
| Electrical Insulation Reliability | G | G | G | G |
| Solder Heat Resistance | G | G | G | G |
| Warpage (mm) | 8.0 | 1.0 | 5.0 | 2.0 |
| Flame Retardancy | G | P | P | G | b. Example Regarding Second Aspect of Invention of Present Application

Synthesis Example 1b

<(A) Compound 1 Having Urethane Bond in Molecule>
Into a reaction vessel equipped with a stirrer, a thermometer, and a nitrogen-inlet tube, 30.00 g of methyl triglyme (1,2-bis(2-methoxyethoxy)ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. Into a resultant solution was added, over 1 hour, a solution (a) in which (i) 50.0 g (0.025 mol) of polycarbonate diol (manufactured by Asahi Kasei Co., Ltd., product name: PCDL T5652, a weight-average molecular weight of 2000) and (ii) 6.51 g (0.050 mol) of 2-hydroxyethyl methacrylate were dissolved into 30.00 g of methyl triglyme. A mixture solution thus obtained was stirred under heating at 80° C. for 5 hours for reaction. As a result of the reaction, a resin solution having, in its molecule, a urethane bond and a methacryloyl group was obtained. The resin solution thus obtained had a solid content concentration of 53% and a weight-average molecular weight of 5,200. Measurements of the solid content concentration and the weight-average molecular weight were carried out by the methods as below.

<Solid Content Concentration>
Measurement of the solid content concentration was carried out in accordance with JIS K 5601-1-2. As a drying condition, a condition of 170° C. for 1 hour was selected.

<Weight-Average Molecular Weight>
Apparatus used: equivalent of HLC-8220GPC manufactured by TOSOH Corporation
Column: TSK gel Super AWM-H manufactured by TOSOH Corporation (6.0 mm I.D.×15 cm) (2 columns)

Guard column: TSK guard column Super AW-H manufactured by TOSOH Corporation
Carrier: 30 mM LiBr+20 mM H3PO4 in DMF
Flow speed: 0.6 mL/min
Column temperature: 40° C.
Detection conditions: RI:polarity (+), response (0.5 sec)
Sample concentration: approximately 5 mg/mL Synthesis Example 2b <(A) Compound 2 Having Urethane Bond in Molecule>

Into a reaction vessel equipped with a stirrer, a thermometer, and a nitrogen-inlet tube, 30.00 g of methyl triglyme (1,2-bis(2-methoxyethoxy)ethane) was poured as a solvent for polymerization. Then, 10.31 g (0.050 mol) of norbornene diisocyanate was added thereto, and a mixture was heated to 80° C., while being stirred under nitrogen stream, so that the norbornene diisocyanate was dissolved in the solvent. Into a resultant solution was added, over 1 hour, a solution (a) in which (i) 50.0 g (0.025 mol) of polycarbonate diol (manufactured by Asahi Kasei Co., Ltd., product name: PCDL T5652, a weight-average molecular weight of 2000) and (ii) 3.70 g (0.025 mol) of 2,2-bis(hydroxymethyl)butanoic acid were dissolved into methyl triglyme (30.0 g). A mixture solution thus obtained was stirred under heating at 80° C. for 5 hours for reaction. As a result of the reaction, a resin solution having, in its molecule, a urethane bond and a carboxyl group was obtained. A resin solution thus obtained had a solid content concentration of 52%, a weight-average molecular weight of 5,600, and an acid number of 22 mg KOH/g based on a solid content. Measurements of the solid content concentration and the weight-average molecular weight were carried out by the same method as in Synthesis Example 1b, and measurement of the acid number was carried out by the method as below.

<Acid Number>

Measurement of the acid number was carried out in accordance with JIS K 5601-2-1.

Examples 1b to 4b and Comparative Example 1b

<Preparation of Resin Composition>

Each of the components (A) obtained in Synthesis Example 1b and 2b, (B) spherical organic beads, (C) fine particles containing elemental phosphorus, a (D) thermosetting resin, a (E) photopolymerization initiator, other components, and an organic solvent were mixed to prepare a resin composition. Respective amounts of constituent raw materials in terms of a resin solid content, and types of the constituent raw materials are shown in Table 4. In Table 4, the amount of 1,2-bis(2-methoxyethoxy)ethane as a solvent indicates a total amount of solvent including a solvent contained in the resin solution obtained by the above synthesis. First, the resin composition was blended in a stirring device equipped with a general stirring blade. Thereafter, the resin composition passed twice through a triple roll mill so as to be a uniform solution. As a result of measurement of respective particle diameters of components contained in the resin composition by a grindometer, all the components contained in the resin composition are not larger than 15 μm in particle diameter. The resin composition thus obtained was set in a defoaming device so that the resin composition was completely defoamed. A resultant resin composition was then evaluated as follows.

TABLE 4

| | | | | | | Unit: Part by Weight |
|---|---|---|---|---|---|---|
| Component | | Ex. 1b | Ex. 2b | Ex. 3b | Ex. 4b | Com. Ex. 1b |
| (A) | Synthesis Example 1 | 60.0 | — | 60.0 | 60.0 | 18.0 |
| | Synthesis Example 2 | — | 60.0 | — | — | — |
| (B) | Dynamic Beads UCN-8070CM Clear <1> | 40.0 | 45.0 | 25.0 | 50.0 | 20.0 |
| (C) | Exolit OP-935 <2> | 30.0 | 30.0 | 30.0 | 30.0 | 30.0 |
| (D) | TEPIC-SP <3> | 10.0 | 10.0 | 10.0 | 10.0 | 10.0 |
| (E) | IRGACURE 369 <4> | 3.0 | 3.0 | 3.0 | 3.0 | 3.0 |
| Others | FANCRYL FA-321M <5> | 15.0 | 15.0 | 15.0 | 15.0 | 15.0 |
| | FLOWLEN AC-2000 <6> | 1.0 | 1.0 | 1.0 | 1.0 | 1.0 |
| Solvent | 1,2-bis(2-methoxyethoxy)ethane | 100.0 | 100.0 | 100.0 | 100.0 | 100.0 |

<1> Manufactured by Dainichiseika Colour & Chemicals Mfg. Co., Ltd., product name of spherical organic beads (crosslinked spherical organic beads containing a urethane bond in its molecule), average particle diameter of 7 μm
<2> Manufactured by Clariant Japan K.K., product name of fine particles (diethylphosphinate aluminum salt) containing elemental phosphorus, average particle diameter of 2.5 μm
<3> Manufactured by Nissan Chemical Industries, Ltd., product name of a thermosetting resin (triglycidyl isocyanurate)
<4> Manufactured by BASF Japan Ltd., product name of a photopolymerization initiator
<5> Manufactured by Hitachi Chemical Co., Ltd., product name of EO-modified bisphenol A dimethacrylate
<6> Manufactured by Kyoeisha Chemical Co., Ltd., product name of a butadiene defoaming agent <Formation of Cured Film on Polyimide Film>

With the use of a Baker's applicator, the resin composition was flow-cast and applied to a 100 mm×100 mm area of a polyimide film (manufactured by Kaneka Corporation, product name: 25NPI) having a thickness of 25 μm so that a finally dried film had a thickness of 20 μm. A resultant film was dried at 80° C. for 20 minutes and then exposed to ultraviolet rays having an integrated exposure amount of 300 mJ/cm$^2$. Subsequently, the film was developed by spraying a 1.0 weight % sodium carbonate aqueous solution heated at 30° C., at a spraying pressure of 1.0 kgf/mm$^2$ for 90 seconds. After the development, the film was rinsed with purified water sufficiently, and then cured by heating in an oven at 150° C. for 30 minutes. Thus, a laminate of the polyimide film and a cured film provided on the polyimide film was prepared.

<Evaluation of Cured Film>

The cured film thus prepared was evaluated in terms of the following items. Evaluation results are shown in Table 5.

(i) How Component (B) and Component (C) are Dispersed in Insulating Film

Each of the Examples 1a to 7a (i) cut out, with use of a box cutter, a 5 mm×3 mm region from a laminate having a cured film that had been obtained by a method similar to the method described in <Formation of Cured Film on Polyimide Film> above, (ii) formed a protective film layer and a cover glass layer with use of an epoxy-based molding resin and a cover glass respectively on each surface of the above cut-out laminate, that is, a surface on the insulating film side and a surface on the base material side, and (iii) performed, with use of an ion beam, a process of cross section polisher on a cross section of the insulating film which cross section was cut along the thickness direction of the insulating film.

Apparatus used: equivalent of SM-09020CP manufactured by JEOL Ltd.

Processing condition: acceleration voltage of 6 kV

The above-formed cross section of the insulating film which cross section was cut along the thickness direction of the insulating film was observed under a scanning electron microscope.

Apparatus used: equivalent of S-3000N manufactured by Hitachi High-Technologies Corporation Observation condition: acceleration voltage of 15 kV Detector: detection of reflected electrons (composition mode)

Magnification: 1000

(I) "G (Good)" indicates that (i) the component (B) was observed as spherical or elliptical regions that are independent from each other, and (ii) the component (C) was observed as indefinitely-shaped, circular or polygonal regions that are independent from each other.

(II) "P (Poor)" indicates that (iii) the component (B) was not observed as spherical or elliptical regions that are independent from each other, and (ii) the component (C) was not observed as indefinitely-shaped, circular or polygonal regions that are independent from each other.

(ii) Proportion of Total Length of Component (B) Regions with Respect to Length of Line Segment Corresponding to Insulating Film on Imaginary Line Drawn in Cross Section of Insulating Film which Cross Section is Cut Along Thickness Direction of Insulating Film, Imaginary Line Extending from Arbitrary Point of Surface of Insulating Film to Surface of Base Material to be Orthogonal to Surface of Base Material By an observation method similar to the method described in Section (i) as above, each of Examples 1b to 4b and Comparative Example 1b (a) drew a single line in a cross section of the insulating film in a scanning electron microscopic image which cross section is cut along the thickness direction of the insulating film, the line extending from an arbitrary point of a surface of the insulating film to a surface of the base material so as to be orthogonal to the surface of the base material, (b) measured a total length of the component (B) regions on the line, and then (c) measured a proportion of the total length of the component (B) regions with respect to a length of a line segment corresponding to the insulating film on the line.

(iii) Length of Component (B) on Imaginary Line Drawn in Cross Section of Insulating Film which Cross Section is Cut Along Thickness Direction of Insulating Film, Imaginary Line Extending from Arbitrary Point of Surface of Insulating Film to Surface of Base Material to be Orthogonal to Surface of Base Material By an observation method similar to the method described in Section (i) as above, each of Examples 1b to 4b and Comparative Example 1b (a) drew a single line in a cross section of the insulating film in a scanning electron microscopic image which cross section is cut along the thickness direction of the insulating film, the line extending from an arbitrary point of a surface of the insulating film to a surface of the base material so as to be orthogonal to the surface of the base material and (b) measured maximum and minimum lengths of the components (B) regions on the line.

(iv) Length of Component (C) on Imaginary Line Drawn in Cross Section of Insulating Film which Cross Section is Cut Along Thickness Direction of Insulating Film, Imaginary Line Extending from Arbitrary Point of Surface of Insulating Film to Point that is Orthogonal to Surface of Base Material By an observation method similar to the method described in Section (i) as above, each of Examples 1b to 4b and Comparative Example 1b (a) drew a single line in a cross section of the insulating film in a scanning electron microscopic image which cross section is cut along the thickness direction of the insulating film, the line extending from an arbitrary point of a surface of the insulating film to a point that is orthogonal to a surface of the base material and (b) measured maximum and minimum lengths of the components (C) regions on the line.

(v) Tack-Free Property

With the use of a Baker's applicator, the resin composition was flow-cast and applied to a 100 mm×100 mm area of a polyimide film (manufactured by Kaneka Corporation, product name: 25NPI) having a thickness of 25 µm so that a finally dried film had a thickness of 20 µm. A resultant film was dried at 80° C. for 20 minutes to prepare a dried coating film from which the solvent had been dried off. The evaluation of tack-free property on the coating film was carried out in the following method. The thus prepared film equipped with the dried coating film was cut out into strips each having a size of 50 mm×30 mm. The strips of the coating film were overlaid with each other in such a state that coating film sides of the strips face inside. Subsequently, a load of 300 g was placed on the overlaid strips for 3 seconds. Thereafter, the load was removed, and the overlaid strips were then peeled off each other. The coating film sides of the strips thus peeled off were observed. The evaluation was based on definition as follows:

(I) "G (Good)" indicates that the coating films were separated from each other with no tacks left on the coating films;

(II) "U (Unsatisfactory)" indicates that the coating films were slightly stuck to each other with a tack left on the coating films; and (III) "P (Poor)" indicates that the coating films were completely stuck to each other to such a degree that the coating films could not be peeled off each other.

(vi) Folding Endurance

In the same manner as in <Formation of Cured Film on Polyimide Film> above, an insulating-film-laminated film having a thickness of 20 µm was prepared by applying the resin composition on a surface of a polyimide film (APICAL 25NPI manufactured by Kaneka Corporation) having a thickness of 25 µm. The evaluation of folding endurance on the insulating-film-laminated film was carried out in the following method. The insulating-film-laminated film was cut out into strips each having a size of 50 mm×10 mm. Each of the strips was folded in the middle (at a point 25 mm from its edge) to an angle of 180° in such a state that the insulating film faces outside. Then, a load of 5 kg was placed on a folded part of the strip for 3 seconds. After that, the load was removed, and an apex of the folded part was observed microscopically. After the microscopic observation, the strip was unfolded, and a load of 5 kg was then placed on the unfolded strip for 3 seconds. After that, the load was removed, and the strip of the cured-film-laminated film was completely unfolded. The above action was repeatedly carried out. The evaluation of folding endurance on the insulating-film-laminated film was carried out in how many times folding had been carried out before cracking occurred on the folded part. The evaluation was based on definition as follows:

(I) "G (Good)" indicates that no cracking occurred on an insulating film at the completion of a fifth round of folding;

(II) "U (Unsatisfactory)" indicates that no cracking occurred on an insulating film at the completion of a third round of folding; and
(III) "P (Poor)" indicates that cracking occurred on an insulating film at the completion of a first round of folding.
(vii) Electrical Insulation Reliability On a flexible copper-clad laminate (the thickness of an electrolytic copper foil is 12 μm, a polyimide film is APICAL 25NPI manufactured by Kaneka Corporation, and the copper foil is bonded by a polyimide adhesive agent), a comb-shaped pattern (line width/space width=100 μm/100 μm) was formed. The flexible copper-clad laminate was then immersed in a 10 volume % sulfuric acid aqueous solution for 1 minute, rinsed with purified water, and subjected to a surface treatment of the copper foil. After that, in the same manner as in <Formation of Cured Film on Polyimide Film> above, an insulating film having a thickness of 20 μm was formed on the comb-shaped pattern, so as to prepare a test piece. The test piece was set in an environmental test apparatus at 85° C. and 85% RH, and a direct current at 100 V was applied to both ends of the test piece, so as to observe a change in insulation resistance value, an occurrence of migration, and the like. The evaluation was based on definition as follows:
(I) "G (Good)" indicates one in which 1000 hours after the start of the test, a resistance value was not less than $10^8$, and no occurrence of migration, formation of dendrites, or the like was observed; and
(II) "P (Poor)" indicates one in which 1000 hours after the start of the test, an occurrence of migration, formation of dendrites, or the like was observed.
(viii) Solder Heat Resistance In the same manner as in <Formation of Cured Film on Polyimide Film> above, an insulating-film-laminated film having a thickness of 20 μm was prepared by applying the photosensitive resin composition on a surface of a polyimide film (APICAL 75NPI manufactured by Kaneka Corporation) having a thickness of 75 μm.

A resultant insulating-film-laminated film was floated on a solder bath that was completely melted at 260° C., in such a state that an insulating film side of the insulating-film-laminated film was in contact with the solder bath. The evaluation was based on definition as follows:
Ten seconds later, the insulating-film-laminated film was pulled up. This operation was repeated 3 times, and the state of the surface of the film was observed.
(I) "G (Good)" indicates that there was nothing wrong with the insulating film; and
(II) "P (Poor)" indicates that swelling, detachment, and/or the like problem occurred on the insulating film.
(ix) Warpage In the same manner as in <Formation of Cured Film on Polyimide Film> above, an insulating-film-laminated film having a thickness of 20 μm was prepared by applying the resin composition on a surface of a polyimide film (APICAL 25NPI manufactured by Kaneka Corporation) having a thickness of 25 μm.

The insulating-film-laminated film was cut into a film having an area of 50 mm×50 mm, and the film was placed on a flat and smooth table with its insulating film side facing upward. Then, how much an end portion of the film was warped was measured. FIG. 3 is a schematic view illustrating which portion in the film is to be measured. As the amount of warpage on a surface of the polyimide film is less, stress exerted on a surface on a printed wiring board becomes small. This results in that the amount of warpage of the printed wiring board is also decreased. In view of this, it is preferable that the amount of warpage be not more than 5 mm. Note that the film was rated as "P (poor)" when it curled into a tubular form.

(x) Flame Retardancy

In accordance with UL94VTM standard for test for flammability of plastic materials, a flammability test was carried out as follows. In the same manner as in <Formation of Cured Film on Polyimide Film> above, an insulating-film-laminated film having a thickness of 25 μm was prepared by applying the resin composition on both surfaces of a polyimide film (product name: APICAL 25NPI manufacture by Kaneka Corporation) having a thickness of 25 μm. The sample thus prepared was cut into specimens each having a dimension of 50 mm in width, by 200 mm in length, and by 75 μm in thickness (including the thickness of the polyimide film). The specimens were each marked with a line across the specimen width at a 125 mm position from one end of the specimen. The specimen was then rolled into a tubular form having a diameter of approximately 13 mm, and overlapping ends of the specimen were secured, without clearance, within the 75 mm portion above the 125 mm line by means of a PI tape. In this manner, 20 tubes for use in the flammability test were prepared. Out of 20 tubes, 10 tubes were processed (1) at 23° C. and a relative humidity of 50% for 48 hours, whereas the remaining 10 tubes were processed (2) at 70° C. for 168 hours and then cooled for more than 4 hours in a desiccator containing anhydrous calcium chloride. These specimens were each clamped at the upper end portion of the specimen so as to be fixed upright, and flame of a burner was applied to a free lower end portion of the specimen for 3 seconds so that the free lower end portion was ignited. After a lapse of 3 seconds, the flame of the burner was removed from the specimen, and the length of time (in seconds) for which the specimen continued to flame and/or burn after the burner had been removed from the specimen was measured. The evaluation was based on definition as follows:
(I) "G (Good)" indicates that the specimen, out of two sets of the specimens processed respectively under the conditions (1) and (2), ceased to flame and/or burn and automatically became extinct within an average of 10 seconds (average time for each set of 10 tubes) at maximum after the removal of the burner from the specimen, and each of the specimens ceased to burn before flaming reaches the 125 mm marked line.
(II) "P (Poor)" indicates that even one specimen did not extinct within 10 seconds after the removal of the burner, or even one specimen burned with flame going up to or beyond the marked line.

TABLE 5

| Evaluation Item | Ex. 1b | Ex. 2b | Ex. 3b | Ex. 4b | Com. Ex. 1b | Com. Ex. 2b | Com. Ex. 3b | Com. Ex. 4b |
|---|---|---|---|---|---|---|---|---|
| How Components (B) and (C) are dispersed | G | G | G | G | G | P | P | P |
| Proportion (%) of Length Occupied by Component (B) | 31.3 | 48.2 | 21.7 | 45.6 | 17.4 | — | 17.9 | — |

TABLE 5-continued

| Evaluation Item | Ex. 1b | Ex. 2b | Ex. 3b | Ex. 4b | Com. Ex. 1b | Com. Ex. 2b | Com. Ex. 3b | Com. Ex. 4b |
|---|---|---|---|---|---|---|---|---|
| Length (μm) of Particles of Component (B) | | | | | | | | |
| Maximum Length | 12.4 | 14.1 | 13.7 | 14.8 | 10.8 | — | 0.6 | — |
| Minimum Length | 2.8 | 3.1 | 3.8 | 3.2 | 2.4 | — | 0.2 | — |
| Length (μm) of Particles of Component (C) | | | | | | | | |
| Maximum Length | 5.4 | 4.7 | 4.2 | 3.2 | 6.3 | — | — | 20.5 |
| Minimum Length | 0.4 | 0.2 | 0.3 | 0.2 | 0.5 | — | — | 0.6 |
| Tack-free Property | G | G | U | G | P | P | P | P |
| Folding Endurance | G | G | G | G | U | G | P | P |
| Electrical Insulation Reliability | G | G | G | G | G | G | G | G |
| Solder Heat Resistance | G | G | G | G | G | G | G | G |
| Warpage (mm) | 2.0 | 1.0 | 1.0 | 1.0 | 8.0 | 1.0 | 5.0 | 2.0 |
| Flame Retardancy | G | G | G | G | G | P | P | G |

Comparative Example 2b

Into a reaction vessel equipped with a stirrer, a thermometer, a nitrogen-inlet tube, a Dean-Stark receiver, and a condenser tube, 58.8 g (0.20 mol) of 2,3,3',4'-biphenyltetracarboxylic acid dianhydride, 30 g (0.40 mol) of 3-aminopropanol, and 200 ml of dimethylacetamide were poured, and a mixture solution thus obtained was stirred under a nitrogen atmosphere at 100° C. for 1 hour. Subsequently, 50 ml of toluene was added to the resultant solution, and the resultant solution was then heated at 180° C. for 4 hours. Water generated by imidization was removed by azeotropic distillation with toluene. A reactant solution thus obtained was poured into 2 L of water, and a precipitate thus formed was separated, rinsed with water, and then dried under reduced pressure to thereby obtain 43.16 g of powder of difunctional hydroxyl-terminated imide oligomer. Next, into a reaction vessel equipped with a stirrer, a thermometer, and a nitrogen-inlet tube, 29.94 g (0.015 mol) of polycarbonate diol (manufactured by Kuraray Co., Ltd., product name: Kuraray Polyol C-2015, a weight-average molecular weight of 2000), 1.01 g (7.50 mmol) of 2,2-bis(hydroxymethyl)propionic acid, 8.53 g (34.09 mol) of 4,4'-diphenylmethane diisocyanate, and 13.7 g of isophorone were poured, and a mixture solution thus obtained was stirred under a nitrogen atmosphere at 80° C. for 1.5 hours. Subsequently, to a resultant solution thus obtained, 6.13 g (15.00 mmol) of the difunctional hydroxyl-terminated imide oligomerimide oligomer prepared as above and 31.9 g of isophorone were added, and a mixture solution was stirred at 80° C. for 1.5 hours. A urethane resin solution thus obtained had a solid content concentration of 50% by weight and a number-average molecular weight of 26,000. The urethane resin solution thus obtained was mixed with 10 parts by mass of epoxy resin (manufactured by Daicel Chemical Industries, Ltd., trade name: EPOLEAD PB3600, epoxy equivalent weight of 194), 20 parts by mass of blocked isocyanate (manufactured by DIC Corporation, product name: BURNOCK D-550), and 0.8 parts by mass of amine-based curing catalyst (manufactured by Shikoku Chemical Corporation, product name: Curezole 2E4MZ), relative to 100 parts by mass of urethane resin, and a resultant mixture was evenly stirred and blended. To the resultant mixture thus obtained, 10 parts by mass of finely powdered silica (manufactured by Nippon AEROSIL Co., Ltd., product name: Aerosil 130, specific surface area (BET method) of 130 m²/g) was further added, and the mixture was stirred and kneaded to thereby obtain a uniformly blended resin composition. Properties evaluation of the resin composition thus obtained was carried out by the same method as in Example 1b. Evaluation results are shown in Table 5.

Comparative Example 3b

A reaction vessel equipped with a stirring device, a thermometer, and a condenser was charged with 70.7 g of polycarbonate diol (manufactured by Kuraray Co., Ltd., product name: Kuraray Polyol C-1065N, a weight-average molecular weight of 991), 13.5 g of 2,2-dimethylolbutanic acid, and 128.9 g of diethylene glycol ethyl ether acetate, and a mixture solution thus obtained was heated to 90° C. to thereby dissolve all these raw materials. The temperature of a reaction solution thus obtained was lowered to 70° C., and 42.4 g of methylene bis(4-cyclohexylisocyanate (manufactured by Sumika Bayer Urethane Co., Ltd., product name: Desmodur-W) was added dropwise to the reaction solution over 30 minutes with a dropping funnel. After completion of the dropwise addition, reaction was carried out at 80° C. for 1 hour, at 90° C. for 1 hour, and at 100° C. for 2 hours. After substantial disappearance of isocanate from the solution was confirmed, 1.46 g of isobutanol (manufactured by Wako Pure Chemical Industries, Ltd.) was added dropwise to the solution, and reaction was then carried out at 105° C. for 1.5 hours. A urethane resin solution thus obtained had a solid content concentration of 50%, a number-average molecular weight of 6,800, and an acid number of 40 mg KOH/g based on a solid content. The urethane resin solution thus obtained was mixed with 37.5% by mass of epoxy resin (manufactured by Japan Epoxy Resins Co., Ltd., product name: jER828EL), 4% by mass of melamine as a curing accelerator, and 20% by mass of organic fine particles having a core-shell multilayer structure (Ganz Chemical Co., Ltd., product name: STAPHYLOID AC-3816, average particle diameter of 0.5 μm), relative to 100% by mass of urethane resin, and a mixture solution thus obtained was stirred and kneaded to thereby obtain a uniformly blended resin composition. Properties evaluation of the resin composition thus obtained was carried out by the same method as in Example 1b. Evaluation results are shown in Table 5.

Comparative Example 4b

Seventy parts by mass (solid content) of a copolymer (weight-average molecular weight of 70,000, acid number of 117 mg/g) prepared by copolymerization of methacrylic acid, methyl methacrylate, and methyl acrylate in proportion of 20:45:35 by mass, 30 parts by mass (solid content) of a urethane-bond-having monomer (manufactured by Shin-Nakamura Chemical Industry Co., Ltd., product name: UA-11), 5 parts by mass of a photopolymerization initiator (manufactured by BASF Japan Ltd., product name: IRGACURE 651), 13 parts by mass of diethylphosphinate aluminum salt (manufactured by Clariant Japan K.K., product name: Exolit OP-930), 10 parts by mass of a thermosetting agent (manufactured by Hitachi Chemical Co., Ltd., 2,2-bis[4-(4-N-maleimidephenoxy)phenyl]propane), 2 parts by mass of a thermal polymerization initiator (manufactured by NOF Corporation, product name: PERHEXYN 25B), 20 parts by mass of methylethyl ketone were mixed with each other, and then stirred and kneaded to thereby obtain a uniformly blended resin composition. Properties evaluation of the resin composition thus obtained was carried out by the same method as in Example 1b. Evaluation results are shown in Table 5.

INDUSTRIAL APPLICABILITY

The insulating film of the present invention is excellent in flexibility of being able to resist repeated foldings, flame retardancy, and electrical insulation reliability, and has reduced warpage. The insulating film is thus particularly suitable as an insulating film for a flexible substrate. The insulating film is further used for any of various wiring line coating protective agents, heat-resistant adhesives, and electric wire/cable insulating coatings.

REFERENCE SIGNS LIST

1 Insulating film
2 Continuous phase
3 Dispersion phase (spherical organic beads)
4 Dispersion phase (fine particles containing at least one element selected from the group consisting of phosphorus, aluminum, and magnesium)
4' Dispersion phase (fine particles containing elemental phosphorus)
5 Base material
6 Imaginary line drawn on a cross section of the insulating film which cross section is cut along a thickness direction of the insulating film, the imaginary line extending from an arbitrary point of a surface of the insulating film to a surface of a base material so as to be orthogonal to the surface of the base material
7 Base material surface
8 Polyimide Film Including Resin Composition Thereon
9 Warpage amount
10 Flat and smooth table

The invention claimed is:

1. An insulating film comprising:
a (A) binder polymer;
(B) spherical organic beads; and
(C) fine particles containing at least one element selected from the group consisting of phosphorus, aluminum, and magnesium,
both the (B) spherical organic beads and the (C) fine particles being dispersed in the insulating film,
the (B) spherical organic beads occupying a 20% to 50% area of any 125 μm×15 μm region of a cross section of the insulating film which cross section is cut along a thickness direction of the insulating film,
the (B) spherical organic beads being cross-linked spherical organic beads having a urethane bond in its molecule,
the (C) fine particles containing at least element selected from the group consisting of phosphorus, aluminum, and magnesium having an average particle diameter of 1 μm to 10 μm.

2. The insulating film as set forth in claim 1, wherein:
the (A) binder polymer is a compound having a urethane bond in its molecule.

3. The insulating film as set forth in claim 1, wherein:
the (C) fine particles are fine particles containing elemental phosphorus.

4. The insulating film as set forth in claim 1, wherein:
more than half of the (B) spherical organic beads present in the 125 μm×15 μm region are 3 μm to 15 μm in particle diameter.

5. The insulating film as set forth in claim 1, wherein:
all of the (B) spherical organic beads present in the 125 μm×15 μm region are not larger than 15 μm in particle diameter.

6. The insulating film as set forth in claim 1, wherein:
a (B) spherical organic bead content therein is 30 to 100 parts by weight, relative to 100 parts by weight of the (A) binder polymer.

7. The insulating film as set forth in claim 1, wherein:
the (C) fine particles present in the 125 μm×15 μm region are 1 μm to 10 μm in particle diameter.

8. The insulating film as set forth in claim 3, wherein:
the (C) fine particles which are the fine particles containing the elemental phosphorus further contain elemental aluminum.

9. The insulating film as set forth in claim 1, further comprising:
a (D) thermosetting resin.

10. The insulating film as set forth in claim 1, further comprising:
a (E) photopolymerization initiator.

11. A printed wiring board provided with an insulating film, wherein:
the insulating film is an insulating film as set forth in claim 1; and
the printed wiring board is laminated with the insulating film.

12. An insulating film comprising:
a (A) compound having a urethane bond in its molecule;
(B) spherical organic beads; and
(C) fine particles containing elemental phosphorus,
both the (B) spherical organic beads and the (C) fine particles being dispersed in the insulating film,
the (B) spherical organic beads being such that a total length of the (B) spherical organic beads makes up 20% to 80% of a length of a line segment corresponding to the insulating film on an imaginary line drawn on a cross section of the insulating film which cross section is cut along a thickness direction of the insulating film, the imaginary line extending from an arbitrary point of a surface of the insulating film to a surface of a base material so as to be orthogonal to the surface of the base material,
the (B) spherical organic beads being cross-linked spherical organic beads having a urethane bond in its molecule,
the (C) fine particles containing elemental phosphorus having an average particle diameter of 1 μm to 10 μm.

13. The insulating film as set forth in claim 12, wherein:
on the imaginary line, a line segment(s) of at least one of the (B) spherical organic beads is 3 μm to 15 μm in length.

14. The insulating film as set forth in claim 12, wherein:
a (B) spherical organic bead content therein is 30 to 100 parts by weight, relative to 100 parts by weight of the (A) compound.

15. The insulating film as set forth in claim 12, wherein:
on the imaginary line, a line segment(s) of at least one of the (C) fine particles is 1 μm to 10 μm in length.

16. The insulating film as set forth in claim 12, wherein:
the (C) fine particles which are the fine particles containing the elemental phosphorus further contain elemental aluminum.

17. The insulating film as set forth in claim 12, wherein:
the insulating film is made up of a resin composition containing a (D) thermosetting resin.

18. The insulating film as set forth in claim 12, wherein:
the insulating film is made up of a resin composition containing a (E) photopolymerization initiator.

19. A printed wiring board provided with an insulating film, wherein:
the insulating film is an insulating film as set forth in claim 12; and
the printed wiring board is laminated with the insulating film.

* * * * *